United States Patent
Akiyama

(10) Patent No.: US 8,638,599 B2
(45) Date of Patent: Jan. 28, 2014

(54) SEMICONDUCTOR STORAGE DEVICE

(71) Applicant: Renesas Electronics Corporation, Kawasaki (JP)

(72) Inventor: Mihoko Akiyama, Hyogo (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/717,403

(22) Filed: Dec. 17, 2012

(65) Prior Publication Data
US 2013/0182497 A1    Jul. 18, 2013

(30) Foreign Application Priority Data
Dec. 16, 2011   (JP) ................... 2011-276044

(51) Int. Cl.
*G11C 11/00*    (2006.01)

(52) U.S. Cl.
USPC .......................................... 365/158; 365/149

(58) Field of Classification Search
USPC ...................... 365/148, 149, 158, 171, 173
See application file for complete search history.

(56) References Cited

U.S. PATENT DOCUMENTS

| 6,885,579 B2 | 4/2005 | Sakimura et al. |
| 6,914,808 B2 | 7/2005 | Inaba |
| 7,167,389 B2 | 1/2007 | Iwata |
| 7,251,154 B2 * | 7/2007 | Hush .............................. 365/148 |
| 7,433,253 B2 * | 10/2008 | Gogl et al. ...................... 365/209 |
| 7,505,334 B1 * | 3/2009 | Breitwisch et al. ....... 365/189.15 |
| 7,916,528 B2 * | 3/2011 | Chen et al. ..................... 365/171 |
| 7,933,139 B2 * | 4/2011 | Lung .............................. 365/148 |
| 8,443,318 B2 * | 5/2013 | Prenat et al. ................... 716/107 |

FOREIGN PATENT DOCUMENTS

| JP | 2004-039150 A | 2/2004 |
| JP | 2004-220759 A | 8/2004 |
| JP | 2005-069744 A | 3/2005 |
| JP | 2005-209245 A | 8/2005 |

* cited by examiner

*Primary Examiner* — Harry W Byrne
*Assistant Examiner* — Lance Reidlinger
(74) *Attorney, Agent, or Firm* — McDermott Will & Emery LLP

(57) ABSTRACT

A semiconductor storage device has tunnel magnetoresistive elements in memory cells. The array includes a memory array having a plurality of memory cells; a plurality of read-word-lines and a plurality of write-word-lines; a plurality of read-bit-lines; a plurality of first write-bit-lines and a plurality of second write-bit-lines; a first driver; a read circuit; a second driver; and a write circuit. The memory cell has a mos transistor, of which one current electrode is coupled to the read-bit-line. A tunnel magnetoresistive element is coupled between a control electrode of the mos transistor and the read-word-line. A capacitive element is coupled to the tunnel magnetoresistive element and forms an RC circuit together with the tunnel magnetoresistive element.

12 Claims, 30 Drawing Sheets

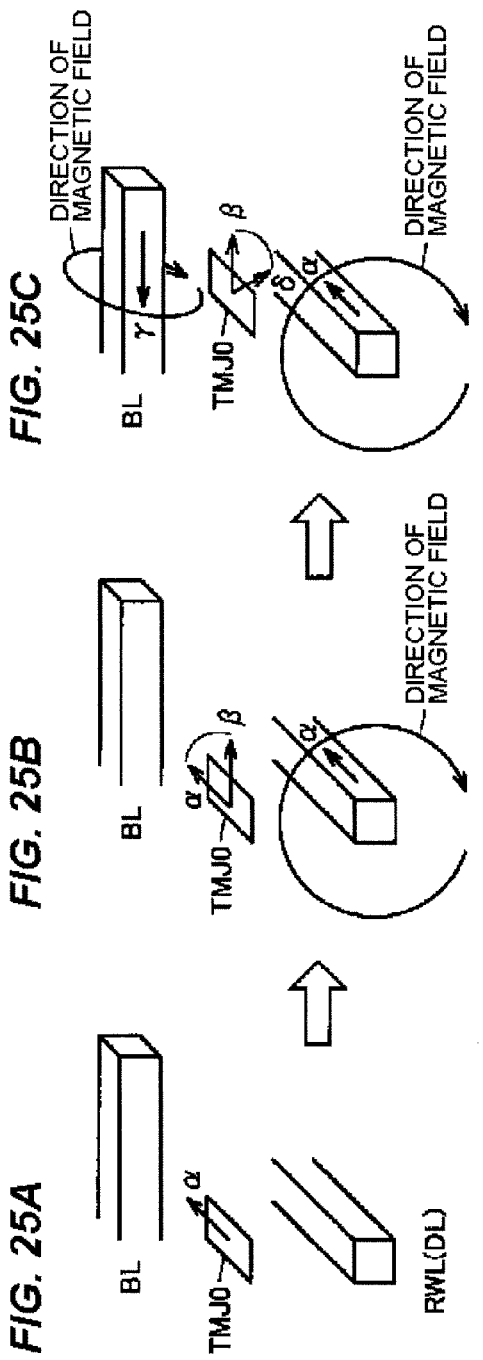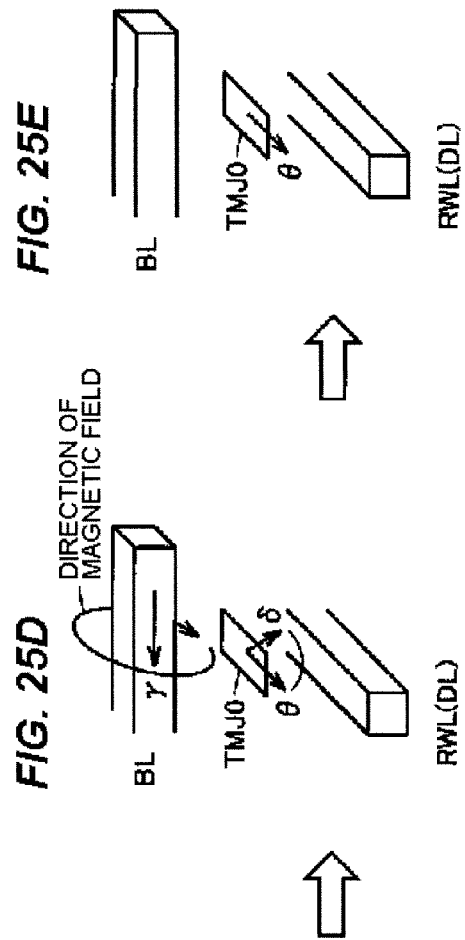

AXIS OF EASY MAGNETIZATION

SEMICONDUCTOR STORAGE DEVICE

CROSS-REFERENCE TO RELATED APPLICATION

The disclosure of Japanese Patent Application No. 2011-276044 filed on Dec. 16, 2011 including the specification, drawings and abstract is incorporated herein by reference in its entirety.

BACKGROUND

The present invention relates to a semiconductor storage device, and particularly to a semiconductor storage device which stores data using magnetoresistive elements.

In recent years, non-volatile memories such as FLASH memories which do not require electric power to retain stored data are often mounted on mobile terminals or the like in place of volatile memories such as SRAMs (Static Random Access Memory) or DRAMs (Dynamic Random Access Memory) which require electric power to retain the stored data, in order to reduce power consumption.

However, it is time consuming to rewrite data stored in FLASH memories, and thus it has been difficult to write data therein at a high speed. Accordingly, MRAMs (Magneto resistive Random Access Memory) which allows rewriting of stored data in a short time are expected as a substitution of FLASH memories.

An MRAM, having a tunnel magnetoresistive element in a plurality of memory cells arranged in a matrix, stores data utilizing variation of a resistance value of the tunnel magnetoresistive element. However, the magnetoresistance ratio (MR ratio, (maximum resistance value−minimum resistance value)/minimum resistance value) of a tunnel magnetoresistive element is about 100% to 70% at most according to current technology, and thus the difference between the maximum resistance value storing the state of data "1" and the minimum resistance value storing the state of data "0" is small, which leads to a problem that data cannot be stably read by reading stored data using only the resistance value.

Therefore, with the MRAM disclosed in Japanese Patent Laid-Open No. 2005-209245 (Patent Document 1) and Japanese Patent Laid-Open No. 2005-069744 (Patent Document 2), the resistance value of the stored data is read by a current sense amplifier using a reference current generated by a combined resistance of the maximum resistance value storing the state of data "1" and the minimum resistance value storing the state of data "0". Accordingly, with the MRAM disclosed in Patent Document 1 and Patent Document 2, a reference current generation circuit which generate a reference current, and a highly precise read amplifier circuit which can detect a minute current are required. In addition, as the MRAM disclosed in Japanese Patent Laid-Open No. 2004-039150 (Patent Document 3), an additional configuration is required to prevent erroneous reading of data due to parasitic current or noise.

Furthermore, with the MRAM disclosed in Japanese Patent Laid-Open No. 2004-220759 (Patent Document 4), a configuration for reading stored data without using a reference current is disclosed. However, with the MRAM disclosed in the Patent Document 4, a special read amplifier circuit which can amplify intermediate voltage of a signal of a read-bit-line to prevent the amplitude of the signal from becoming the maximum amplitude is required.

SUMMARY

An MRAM, having a memory cell formed in a metal layer, can be commonly formed in a process of forming a logic circuit. Accordingly, with an MRAM, it is easy to mixedly mount logic LSIs (Large Scale Integration) over a same semiconductor substrate. However, since the MRAM disclosed in Patent Document 1 and Patent Document 2 need to include a reference cell using a reference current generation circuit, a highly precise read amplifier circuit and a dummy cell, there has been a problem of increased circuit size. In particular, since the MRAM disclosed in Patent Document 1 and Patent Document 2 need to include many circuits that are not required for an SRAM, it is not easy to replace an SRAM mixedly mounted over a logic LSI.

Similarly, since the MRAM disclosed in Patent Document needs to include configuration to prevent erroneous reading of data, and the MRAM disclosed in Patent Document 4 needs to include a special read amplifier circuit, there has been a problem of increased circuit size.

Therefore, the present invention has been made in view of the above circumstances and provides a semiconductor storage device having tunnel magnetoresistive elements in memory cells easy to be mixedly mounted over a semiconductor substrate without increasing the circuit size.

In order to solve the above problems, a semiconductor storage device includes a memory array including a plurality of memory cells arranged in a matrix; a plurality of read-word-lines and a plurality of write-word-lines, each of which is coupled to the memory cells belonging to a column in the memory array; a plurality of read-bit-lines, each of which is precharged to a predetermined voltage and coupled to the memory cells belonging to a row in the memory array; a plurality of first write-bit-lines and a plurality of second write-bit-lines, each of which is coupled to the memory cells belonging to a row in the memory array; a first driver configured to output a one-shot pulse having a predetermined width to the read-word-line when reading data; a plurality of read circuits, each configured to read data stored in the memory cell according to a voltage of the read-bit-line; a second driver configured to output a write signal having a predetermined voltage to the write-word-line when writing data; and a write circuit which supplies a signal according to values of data to be written in the first write-bit-line and the second write-bit-line. The memory cell has a first mos transistor with one of current electrodes being coupled to the read-bit-line; a tunnel magnetoresistive element coupled between a control electrode of the first mos transistor and the read-word-line; and a capacitive element coupled to the tunnel magnetoresistive element and forming an RC circuit together with the tunnel magnetoresistive element.

Since the semiconductor storage device according to the present invention reads data stored in a memory cell in an RC circuit including a tunnel magnetoresistive element and a capacitive element, by controlling whether or not to pass a one-shot pulse having a predetermined width which has been input to a read-word-line, there is no need to include a reference cell using a reference current generation circuit, a highly precise read amplifier circuit and dummy cells or the like. Therefore, it becomes easy to mixedly mount the semiconductor storage device according to the present invention over a semiconductor substrate without increasing the circuit size.

BRIEF DESCRIPTION OF THE DRAWINGS

FIGS. 25A to 25E are schematic views for explaining an operation of writing data in a tunnel magnetoresistive element using a two-axis wiring;

DETAILED DESCRIPTION

Figure 1:
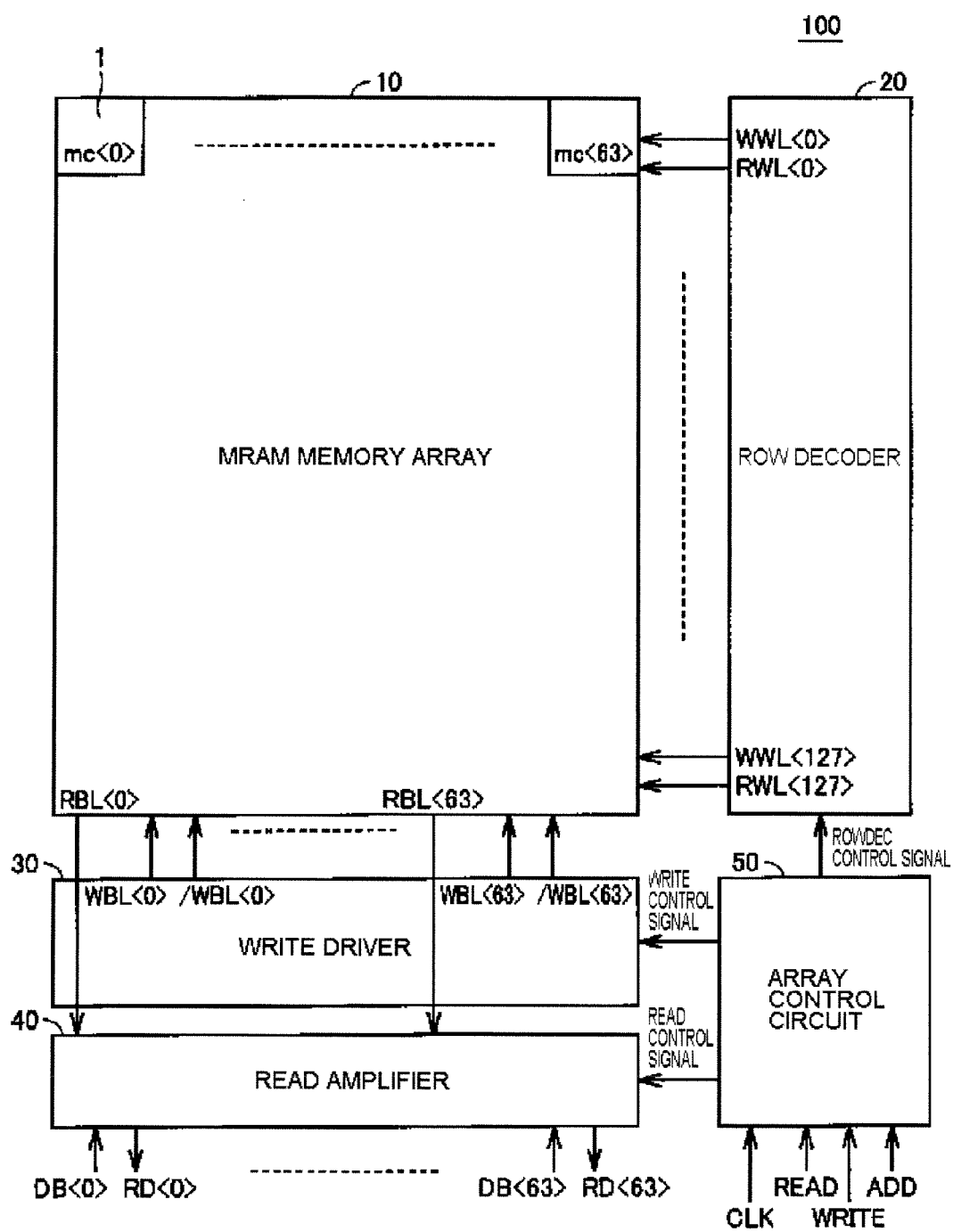
FIG. 1 is a block diagram showing a configuration of a semiconductor storage device according to an embodiment 1 of the present invention.

In the following, embodiments according to the present invention will be described, referring to the drawings.

Embodiment 1

FIG. 1 is a block diagram showing a configuration of a semiconductor storage device according to an embodiment 1 of the present invention. A semiconductor storage device 100 shown in FIG. 1 is an MRAM having tunnel magnetoresistive elements in memory cells 1. The semiconductor storage device 100 includes a memory array 10, a Row decoder 20, a write driver 30, a read amplifier 40, and an array control circuit 50.

The memory array 10 has a plurality of memory cells 1 arranged in a matrix. For example, the memory array 10 has 128 memory cells arranged in the row direction and 64 memory cells (mc<0> to mc<63>) arranged in the column direction.

The Row decoder 20 is coupled to each of a plurality of memory cells 1 belonging to a column in the memory array 10, via a plurality of read-word-lines RWL and a plurality of write-word-lines WWL. The Row decoder 20 is coupled to each of the memory cells 1 belonging to 64 columns, via the 128 read-word-lines RWL and the 128 write-word-lines WWL. In addition, the Row decoder 20 includes a driver (first driver) configured to output a one-shot pulse having a predetermined width to the read-word-line RWL when reading data from the memory cell 1, and a driver (second driver) configured to output a write signal having a predetermined voltage to the write-word-line WWL when writing data in the memory cell 1.

The write driver 30 is coupled to each of the memory cells belonging to a row in the memory array 10, via write-bit-lines WBL (first write-bit-line) and /WBL (second write-bit-line). The write driver 30 is a write circuit which supplies signals according to values of data to be written in the write-bit-lines WBL and /WBL.

The read amplifier 40 is coupled to each of the memory cells 1 belonging to a row in the memory array 10, via a read-bit-line RBL. The read amplifier 40 is a read circuit which reads data stored in the memory cell 1, according to the voltage of the read-bit-line RBL. Note that, the read amplifier 40 uses an inverter amplifier.

The array control circuit 50 is a control circuit which controls the operation of the Row decoder 20, the write driver 30, and the read amplifier 40. The array control circuit 50 receives a clock signal CLK, a read control signal READ, a write control signal WRITE, and an address signal ADD. The array control circuit 50 then outputs a RowDec control signal to the Row decoder 20, a write control signal to the write driver 30, and a read control signal to the read amplifier 40, respectively.

Figure 2:
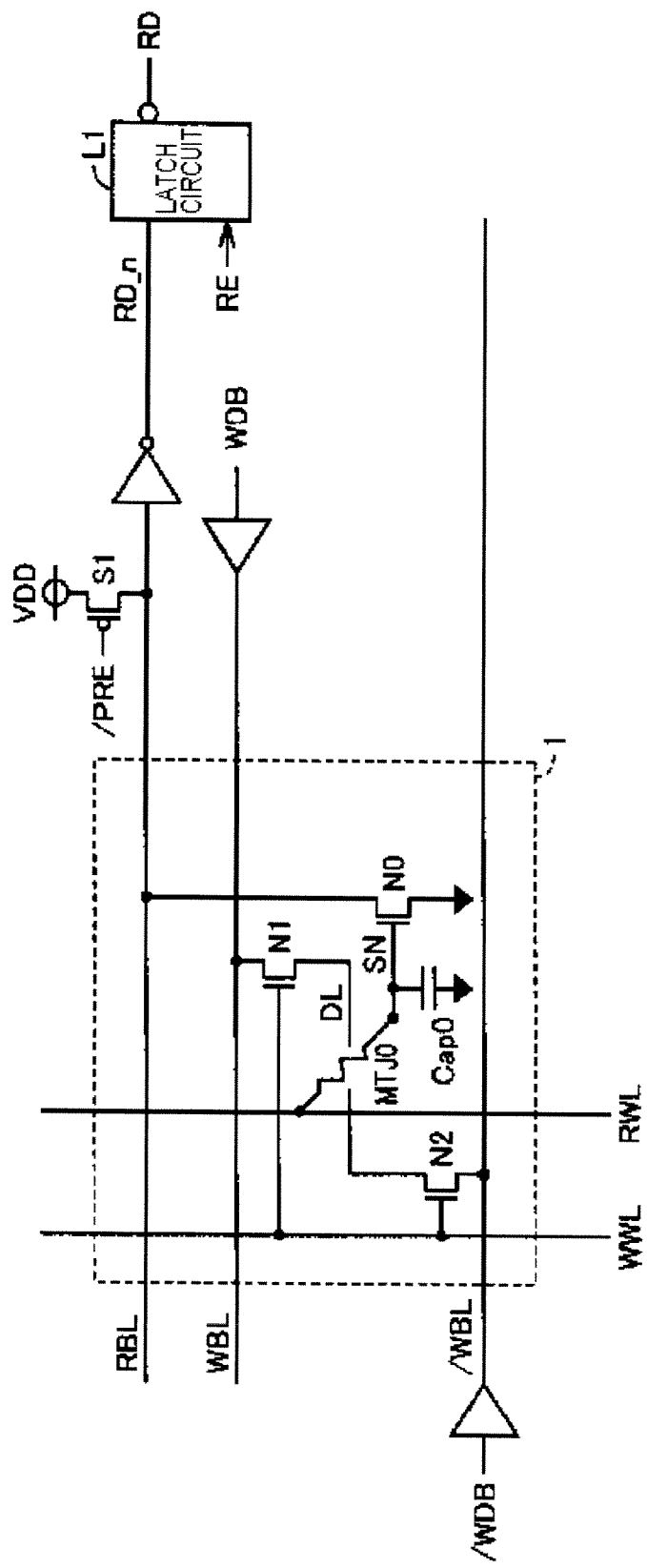
FIG. 2 is a circuit diagram showing a circuit configuration of a memory cell of the semiconductor storage device according to the embodiment 1 of the present invention.

Next, a circuit configuration of the memory cell 1 included in the memory array 10 will be described in detail. FIG. 2 is a circuit diagram showing a circuit configuration of the memory cell 1 of the semiconductor storage device according to the embodiment 1 of the present invention. The memory cell 1, being a basic cell of the MRAM, includes a tunnel magnetoresistive element MTJ0, a capacitive element Cap0, an Nmos (negative-channel metal oxide semiconductor) transistor N0 (first mos transistor), a digit line DL, an Nmos transistor N1 (second mos transistor), and an Nmos transistor N2 (third mos transistor).

The tunnel magnetoresistive element MTJ0 has one end coupled to the read-word-line RWL and the other end coupled to the capacitive element Cap0. The resistance value of the tunnel magnetoresistive element MTJ0 varies according to the direction of magnetization. A smaller one of the resistance values is denoted as R, and a larger one is denoted as R+ΔR. Here, current technology provides ΔR<R and ΔR≈R at most. It is assumed in embodiments of the present invention that "0" is recorded when the resistance value of the tunnel magnetoresistive element MTJ0 is R, and "1" is stored when the resistance value is R+ΔR.

The capacitive element Cap0 is coupled between the other end of the tunnel magnetoresistive element MTJ0 and the control electrode of the Nmos transistor N0. The capacitive element Cap0, forming an RC circuit together with the tunnel magnetoresistive element MTJ0, functions as a low-pass filter circuit or a high-pass filter circuit for a one-shot pulse input from the read-word-line RWL to the control electrode of the Nmos transistor N0, as described below.

The Nmos transistor N0 has its control electrode coupled to the capacitive element Cap0, and has one of its current electrodes coupled to the read-bit-line RBL, respectively. The Nmos transistor N0 then sets the voltage of the read-bit-line RBL, which has been pre-charged to a predetermined voltage, to the ground voltage by switching to ON state according to the data stored in the tunnel magnetoresistive element MTJ0.

The digit line DL, intersecting with the tunnel magnetoresistive element MTJ0 at a predetermined angle, supplies magnetization current for generating a magnetic field in the tunnel magnetoresistive element MTJ0.

The Nmos transistor N1 has its control electrode coupled to the write-word-line WWL, one current electrode coupled to the write-bit-line WBL, and the other current electrode coupled to one end of the digit line DL. Note that, the write-bit-line WBL is coupled to a write data bus WDB via an amplification circuit.

The Nmos transistor N2 has its control electrode coupled to the write-word-line WWL, one current electrode coupled to the other end of the digit line, and the other current electrode coupled to the write-bit-line /WBL. Note that, the write-bit-line /WBL is coupled to a write data bus /WDB via the amplification circuit.

A conventional MRAM determines whether the state of stored data is "0" or "1" by two voltage levels (power source voltage level and ground voltage level) resulting from converting the resistance value of the tunnel magnetoresistive element into current which is subsequently amplified and converted into voltage by a current sense amplifier. Specifically, a conventional MRAM provides a dummy cell, causes electric current to flow in both a combined resistance value of a smaller one and a larger one of resistance values of the tunnel magnetoresistive element of the dummy cell, and a resistance value of a tunnel magnetoresistive element of a memory cell to be read, and converts the resistance value into electric current. The conventional MRAM amplifies the current which has been converted from the combined resistance value by a factor of two by the current sense amplifier to generate reference current, and compares the reference current with the current of the memory cell to be read, and reads data "0" or "1" stored in a memory cell.

However, the conventional MRAM needs to include a reference cell using a reference current generation circuit, a highly precise read amplifier circuit and dummy cells and the like, and thus the circuit size becomes large.

Therefore, in the semiconductor storage device 100 according to the embodiment 1 of the present invention, the low-pass filter circuit is configured with the resistance of the tunnel magnetoresistive element MTJ0 and the capacitive element Cap0 of the memory cell 1. Therefore, the semiconductor storage device 100 uses a method of determining and reading whether the state of stored data is "0" or "1" based on the time constant ratio of the low-pass filter circuit, instead of the method of determining and reading whether the state of stored data is "0" or "1" based on the magnetoresistance ratio (MR ratio) of the tunnel magnetoresistive element MTJ0.

In other words, the semiconductor storage device 100 determines whether the state of stored data is "0" or "1" based on two states, i.e., either the one-shot pulse that entered the tunnel magnetoresistive element MTJ0 passes through the low-pass filter circuit or is blocked by the low-pass filter circuit. The semiconductor storage device 100 then varies the voltage of the read-bit-line RBL which has been pre-charged to a predetermined voltage, by the Nmos transistor N0 coupled to the low-pass filter circuit, to read the data determined by the read amplifier 40. Therefore, it becomes possible for the semiconductor storage device 100 to cause the read-bit-line RBL to oscillate at full amplitude, and whereby an MRAM capable of noise immune, high-speed reading can be realized, without requiring a highly precise read amplifier circuit.

In addition, since all the input and output signals of the memory cell 1 in the semiconductor storage device 100 can be converted into digital signals, it is not necessary to apply bias voltage or read analog signals from a word-bit-line as with a conventional MRAM, facilitating substitution of the SRAM memory and register memory.

Next, the principle of the read operation of reading data from the memory cell 1 of the semiconductor storage device 100 will be described in more detail.

The memory cell 1 of the semiconductor storage device 100 expresses "0" or "1" of the state of stored data using the characteristic that the resistance value of the tunnel magnetoresistive element MTJ0 varies according to the direction of magnetization. A smaller one of the resistance values is denoted as R, and a larger one is denoted as R+ΔR. Since the MR ratio of a tunnel magnetoresistive element MTJ0 based on common technology is about 70%, ΔR≈0.7R is obtained.

For example, it is assumed with the memory cell 1 of the semiconductor storage device 100 that the state of stored data "0" is expressed by the resistance value R of the tunnel magnetoresistive element MTJ0 and the state of stored data "1" is expressed by the resistance value R+ΔR of the tunnel magnetoresistive element MTJ0.

The tunnel magnetoresistive element MTJ0 shown in FIG. 2 has one end coupled to the read-word-line RWL, and the other end coupled to the capacitive element Cap0 formed with a mos capacity or the like, and to the control electrode of the Nmos transistor N0 for reading. Seen from the read-word-line RWL side, a low-pass filter circuit with a time constant of $2\pi RC$ is formed by the tunnel magnetoresistive element MTJ0 with a resistance value R and the capacitive element Cap0 with a capacity value C and, according to the pulse width of a one-shot pulse (RWL signal) input from the read-word-line RWL, two states can be taken, i.e., whether the one-shot pulse (RWL signal) is transmitted to a node SN (passes through the low-pass filter circuit) or is not transmitted thereto (blocked by the low-pass filter circuit).

Figure 3:
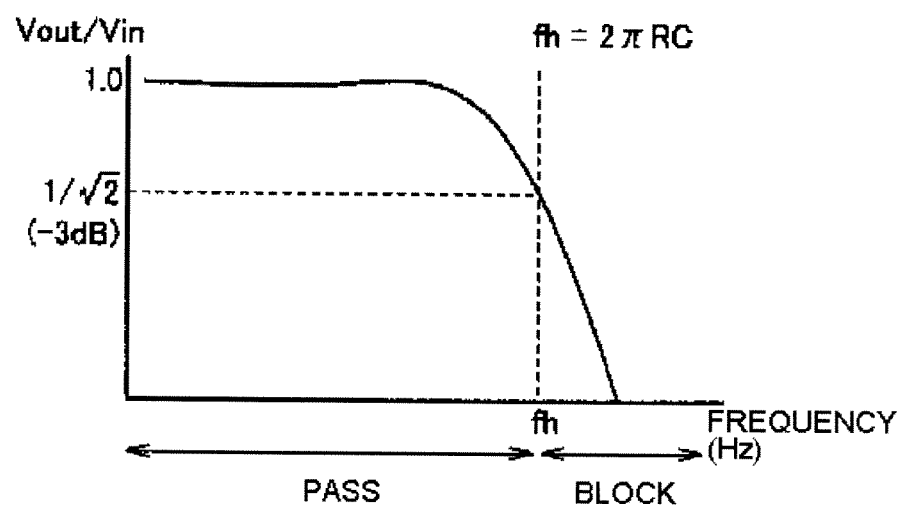
FIG. 3 is a graph showing the characteristics of a low-pass filter circuit having a time constant 2πRC.

FIG. 3 is a graph showing the characteristics of a low-pass filter circuit having a time constant $2\pi RC$. The horizontal axis shown in FIG. 3 expresses frequency (Hz) and the vertical axis expresses input and output voltage ratio (Vout/Vin). In the graph shown in FIG. 3, the time constant is $2\pi RC$=frequency fh, and the input and output voltage ratio (Vout/Vin) of the low-pass filter circuit has decreased by −3 dB. In other words, the low-pass filter circuit shown in FIG. 3 transmits input signals with frequencies equal to or lower than fh, while blocking input signals with frequencies exceeding fh.

For example, assuming that the resistance value of the tunnel magnetoresistive element MTJ0 storing data "1" is 30 KΩ and the capacity value of the capacitive element Cap0 is 8 fF, the time constant becomes 1.508 ns, thereby forming a low-pass filter circuit that filters high frequency pulses with cycles equal to or lower than 1.508 ns. Accordingly, when the pulse width of a one-shot pulse (RWL signal) at the standby state "0" is 1 ns, the one-shot pulse is blocked by the low-pass filter circuit formed with the tunnel magnetoresistive element MTJ0 and the capacitive element Cap0, with the state of the node SN remaining at "0".

In addition, assuming that the resistance value of the tunnel magnetoresistive element MTJ0 storing data "0" is 17.5 KΩ and the capacity value of the capacitive element Cap0 is 8 fF, the time constant becomes 0.879 ns, thereby forming a low-pass filter circuit that filters high frequency pulses with cycles equal to or lower than 0.879 ns. Accordingly, when the pulse width of a one-shot pulse (RWL signal) at the standby state "0" is 1 ns, the one-shot pulse passes through the low-pass filter circuit formed with the tunnel magnetoresistive element MTJ0 and the capacitive element Cap0, with the state of the node SN transiting from "0" to "1" to "0".

By converting the difference of resistance values of the tunnel magnetoresistive element MTJ0 based on data "0" and "1" stored in the memory cell 1 into a difference of time constants of a low-pass filter circuit, it is thus possible to create two states, i.e., whether the low-pass filter circuit transmits or blocks a one-shot pulse. Then, the memory cell 1, including the Nmos transistor N0 as an amplifier which amplifies the two states in the node SN, amplifies the two states of the one-shot pulse to two states i.e., the "power source voltage level" and the "ground voltage level" by switching, by the Nmos transistor N0, grounding or not grounding the read-bit-line RBL which has been pre-charged to the power source voltage. Accordingly, the semiconductor storage device 100 can read two states, i.e., "power source voltage level" and "ground voltage level" by the read amplifier 40, thereby realizing an MRAM capable of noise immune, high speed reading without requiring a highly precise read amplifier circuit.

Figure 4:
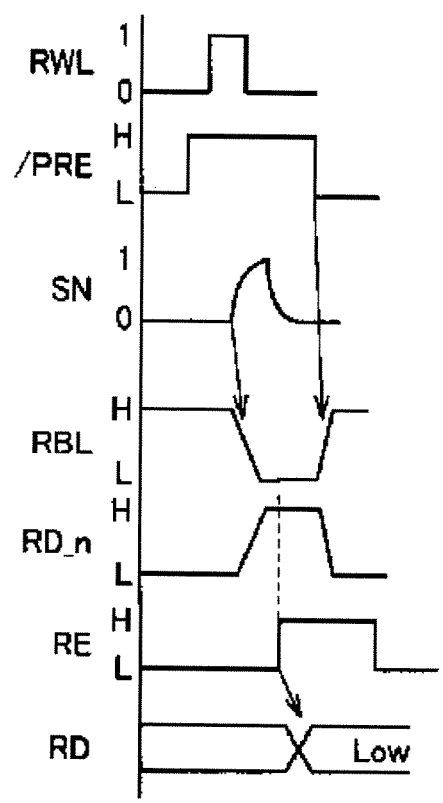
FIG. 4 is a waveform chart showing a signal waveform when the semiconductor storage device according to the embodiment 1 of the present invention reads, from a memory cell, data "0" stored therein.
Figure 5:
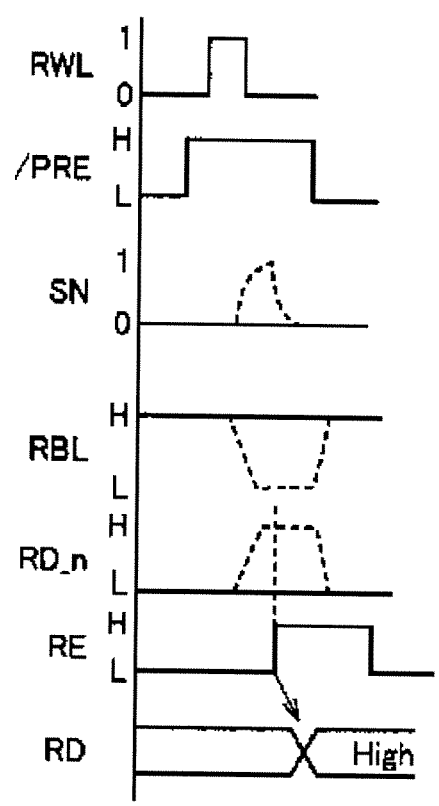
FIG. 5 is a waveform chart showing a signal waveform when the semiconductor storage device according to the embodiment 1 of the present invention reads, from a memory cell, data "1" stored therein.

Next, an operation of the semiconductor storage device 100 to read the data stored in the memory cell 1 will be described in more detail, using a signal waveform. FIG. 4 is a waveform chart showing a signal waveform when the semiconductor storage device 100 according to the embodiment 1 of the present invention reads, from the memory cell 1, data "0" stored therein. FIG. 5 is a waveform chart showing a signal waveform when the semiconductor storage device 100 according to the embodiment 1 of the present invention reads, from the memory cell 1, data "1" stored therein.

The signal waveforms shown in FIGS. 4 and 5 are, from top to bottom of the drawings, an RWL signal input to the read-word-line RWL, an /PRE signal input to a switch element S1 which pre-charges the read-bit-line RBL to the power source voltage VDD, an SN signal of the node SN, an RBL signal of the read-bit-line RBL, an RD_n signal obtained by inverting and amplifying the RBL signal, an RE signal to be input to a latch circuit L1, and an RD signal output from the latch circuit L1.

First, the semiconductor storage device 100 pre-charges the read-bit-line RBL to the power source voltage level (VDD level) by inputting an /PRE signal at an "L" level to the switch element S1. The semiconductor storage device 100 inputs an /PRE signal at a "H" level to the switch element S1 before reading data from the memory cell 1, with the read-bit-line RBL being retained to the power source voltage level.

The node SN can take one of two states, i.e., whether to transmit or block a one-shot pulse (RWL signal), based on the difference of time constants ($2\pi RC$) of a low-pass filter circuit formed with the tunnel magnetoresistive element MTJ0 and the capacitive element Cap0. Accordingly, since the resistance value of the tunnel magnetoresistive element MTJ0 is small (e.g., 15 KΩ) for the stored data "0", allowing a one-shot pulse with a low frequency pulse (e.g., a pulse width of 1 ns) to pass through, the SN signal of the node SN shown in FIG. 4 rises from "0" to "1" and falls from "1" to "0". Rising of the SN signal of the node SN from "0" to "1" turns ON the Nmos transistor N0 and grounds the read-bit-line RBL, and whereby the voltage level of the RBL signal of the read-bit-line RBL falls from the "H" level of the power source voltage level to the "L" level of the ground voltage level.

Since the RD_n signal is an inverted and amplified signal of the RBL signal of the read-bit-line RBL, it has a waveform which rises from the "L" level to the "H" level. The latch circuit L1 retains the RD_n signal at the "H" level and outputs an RD signal at the "Low" level corresponding to data "0" stored in the memory cell 1, at the timing when the RE signal rises from the "L" level to the "H" level. Note that, the read-bit-line RBL is pre-charged to the power source voltage level by the input of the /PRE signal at the "H" level to the switch element S1 again after the SN signal has fallen from "1" to "0", and the RBL signal returns to the "H" level.

Since the resistance value of the tunnel magnetoresistive element MTJ0 is large (e.g., 30 KΩ) for the stored data "1", and the one-shot pulse of a high frequency pulse (e.g., a pulse width of 1 ns) is blocked, the SN signal of the node SN shown in FIG. 5 does not have a waveform indicated by the dashed line but remains "0". Since the SN signal of the node SN remains "0", the Nmos transistor N0 remains in the OFF state, with the RBL signal of the read-bit-line RBL being retained at the "H" level of the power source voltage level without taking a waveform as shown by the dashed line.

Since the RD_n signal is an inverted and amplified signal of the RBL signal of the read-bit-line RBL, it is retained at the "L" level without taking a waveform as shown by the dashed line. The latch circuit L1 retains the RD_n signal at the "L" level and outputs an RD signal at the "High" level corresponding to the data "1" stored in the memory cell 1, at the timing when the RE signal rises from the "L" level to the "H" level.

Since the read amplifier 40 detects the voltage level to read data stored in the memory cell 1, instead of sense-amplifying the current of the read-bit-line RBL to read data stored in the memory cell 1 as described above, it becomes possible to form the read amplifier 40 with an ordinary inverter without requiring a highly precise read amplifier circuit, thereby realizing an MRAM capable of noise immune, high speed reading.

Next, the principle of the writing operation of writing data in the memory cell 1 of the semiconductor storage device 100 will be described in more detail.

Figure 6:
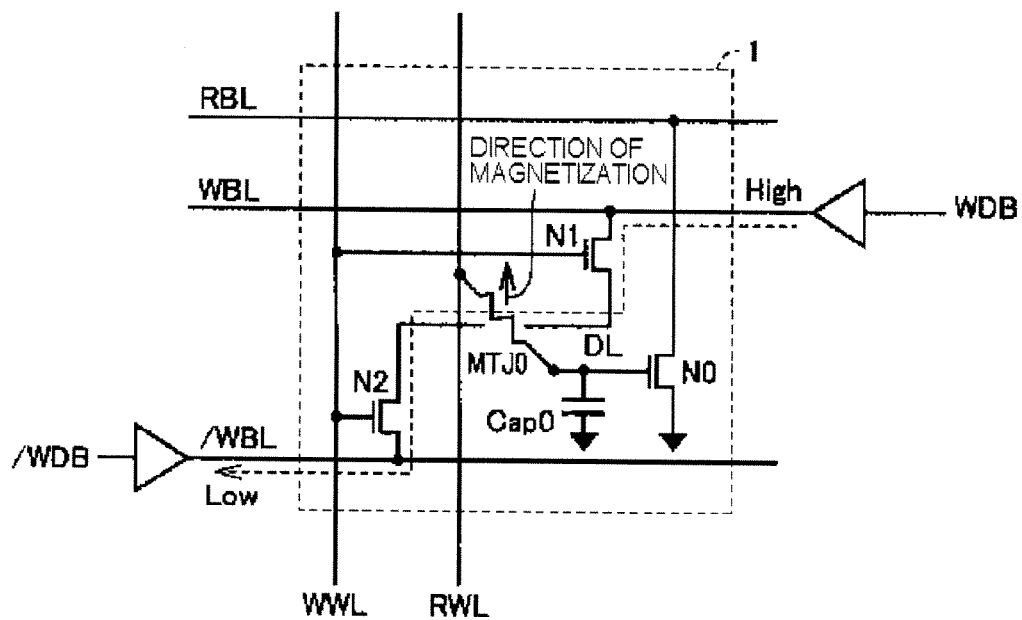
FIG. 6 is a schematic view showing a configuration when the semiconductor storage device according to the embodiment 1 of the present invention writes data "1" in a memory cell.
Figure 7:
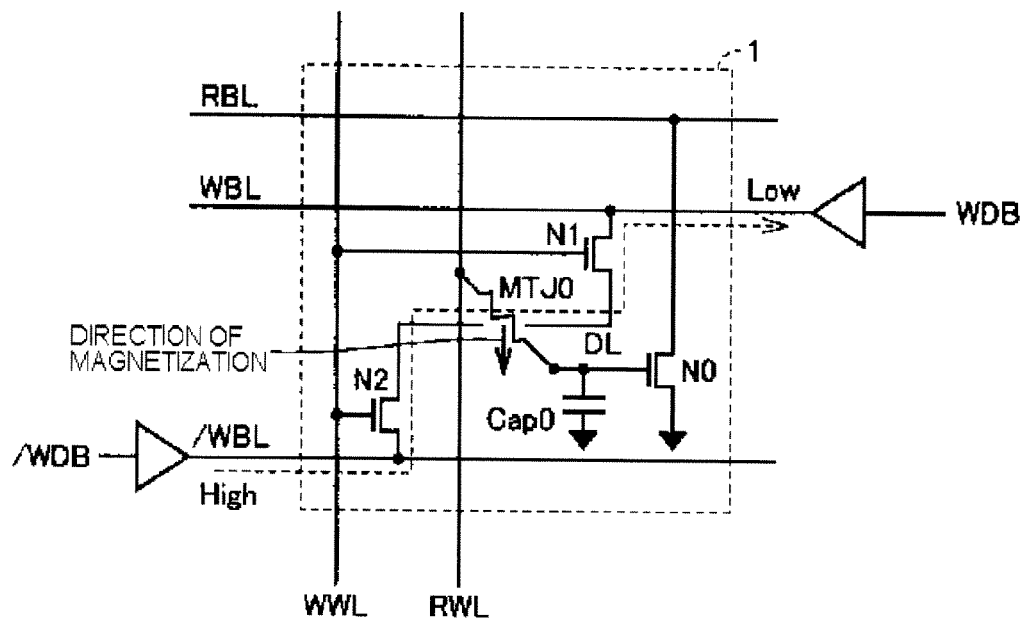
FIG. 7 is a schematic view showing a configuration when the semiconductor storage device according to the embodiment 1 of the present invention writes data "0" in a memory cell.

FIG. 6 is a schematic view showing a configuration when the semiconductor storage device 100 according to the embodiment 1 of the present invention writes data "1" in the memory cell 1. FIG. 7 is a schematic view showing a configuration when the semiconductor storage device 100 according to the embodiment 1 of the present invention writes data "0" in the memory cell 1. The memory cell 1 shown in FIGS. 6 and 7 has the digit line DL arranged diagonally to the write-word-line WWL by approximately 45 degrees, and wired perpendicular to the write-word-line WWL and the read-word-line RWL, and parallel to the write-bit-lines WBL and /WBL. Note that, the digit line DL is wired in the lower layer of the tunnel magnetoresistive element MTJ0 as described below.

The digit line DL, which is coupled to the Nmos transistors N1 and N2, brings the write-bit-line WBL and the write-bit-line /WBL into conduction by turning ON the Nmos transistors N1 and N2 when writing data in the memory cell 1. Bringing the write-bit-line WBL and the write-bit-line /WBL into conduction via the digit line DL allows electric current to flow in the positive or negative direction through the digit line DL. In other words, the digit line DL can provide the tunnel magnetoresistive element MTJ0 with magnetic fields in two directions by causing electric current to flow in the positive or negative direction.

Specifically, with the memory cell 1 shown in FIG. 6, since data "1" is written in the memory cell 1, a WDB signal at the "High" level is input to the write-bit-line WBL and an /WDB signal at the "Low" level is input to the write-bit-line /WBL. Note that, during the standby state except when data is written in the memory cell 1, a WDB signal at the "Low" level is input to both the write-bit-lines WBL and /WBL.

Then, when writing data in the memory cell 1, inputting a signal at the "H" level to the write-word-line WWL to turn ON the Nmos transistors N1 and N2 brings the write-bit-line WBL and the write-bit-line /WBL in conduction, thereby causing electric current to flow in a direction from the write-bit-line WBL to the write-bit-line /WBL, to provide the tunnel magnetoresistive element MTJ0 with a magnetic field in the upward direction in the drawing.

With the memory cell 1 shown in FIG. 7, since data "0" is written in the memory cell 1, a WDB signal at the "Low" level is input to the write-bit-line WBL and an /WDB signal at the "High" level is input to the write-bit-line /WBL.

Further, when writing data in the memory cell 1, inputting a signal at the "H" level to the write-word-line WWL to turn ON the Nmos transistors N1 and N2 brings the write-bit-line WBL and the write-bit-line /WBL in conduction, thereby causing electric current to flow in a direction from the write-bit-line /WBL to the write-bit-line WBL, to provide the tunnel magnetoresistive element MTJ0 with a magnetic field in the downward direction in the drawing.

The tunnel magnetoresistive element MTJ0 can change the direction of magnetization by providing magnetic fields in two directions, making it possible to write a state of data "0" with a small resistance value and a state of data "1" with a large resistance value.

Figure 8:
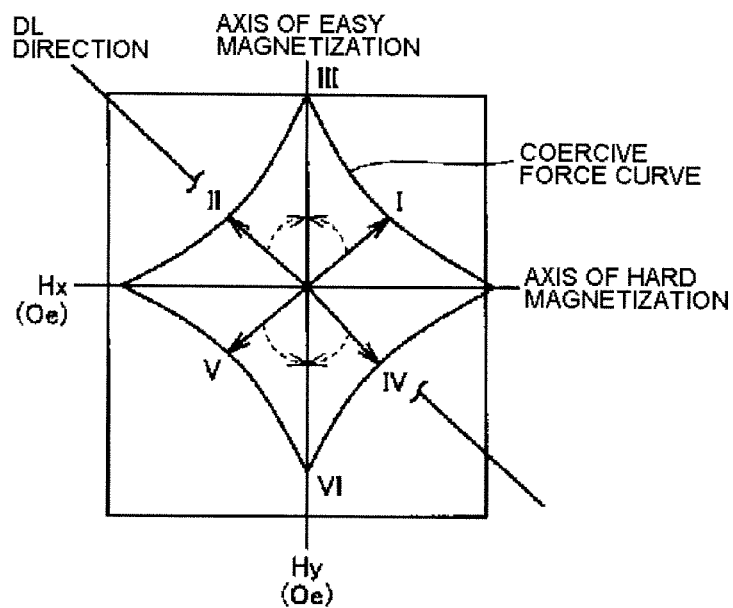
FIG. 8 shows an asteroid curve of a tunnel magnetoresistive element.
Figure 9A:
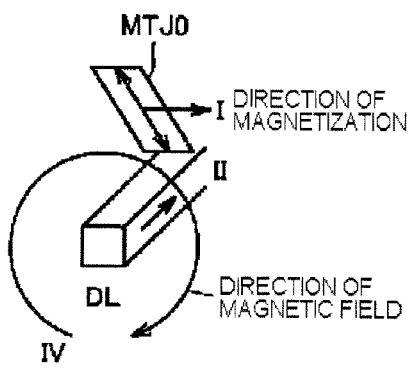
FIGS. 9A and 9B are schematic views for explaining a direction of magnetization of a tunnel magnetoresistive element.
Figure 9B:
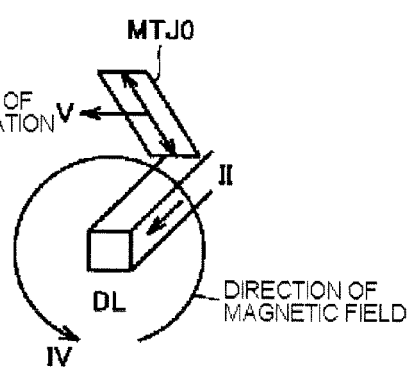

Changing the direction of magnetization of the tunnel magnetoresistive element MTJ0 by providing magnetic fields in two directions will be explained referring to drawings. FIG. 8 shows an asteroid curve of the tunnel magnetoresistive element MTJ0. FIGS. 9A and 9B are schematic views for explaining the direction of magnetization of the tunnel magnetoresistive element MTJ0.

The asteroid curve shown in FIG. 8 illustrates an axis of easy magnetization, an axis of hard magnetization, and a coercive force curve of the tunnel magnetoresistive element MTJ0. The direction of the digit line DL lies in the direction of approximately 45 degrees with respect to the axis of easy magnetization and the axis of hard magnetization of the tunnel magnetoresistive element MTJ0.

The direction of magnetization of the tunnel magnetoresistive element MTJ0 lies in the direction III or the direction VI in the drawing during the standby state except when data is written in the memory cell 1. Since the digit line DL is wired in the direction II and the direction IV in the drawing, causing electric current to flow from the direction IV to the direction II as shown in FIG. 9A, for example, generates a magnetic field in the direction of an arrow around the digit line DL according to the right screw rule, with the direction of magnetization of the tunnel magnetoresistive element MTJ0 being in the direction I. The direction of magnetization of the tunnel magnetoresistive element MTJ0, after having been oriented in the direction I, stabilizes in the direction III of the axis of easy magnetization, upon stopping the electric current flowing in the digit line DL.

On the contrary, causing electric current to flow from the direction II to the direction IV as shown in FIG. 9B generates a magnetic field in the direction of an arrow around the digit line DL according to the right screw rule, with the direction of magnetization of the tunnel magnetoresistive element MTJ0 being in the direction V. The direction of magnetization of the tunnel magnetoresistive element MTJ0, after having been oriented in the direction V, stabilizes in the direction VI of the axis of easy magnetization, upon stopping the electric current to flow in the digit line DL.

As described above, the semiconductor storage device 100 can change the direction of magnetization of the tunnel magnetoresistive element MTJ0 by changing the direction of electric current flowing in the digit line DL to provide magnetic fields in two directions.

Figure 10:
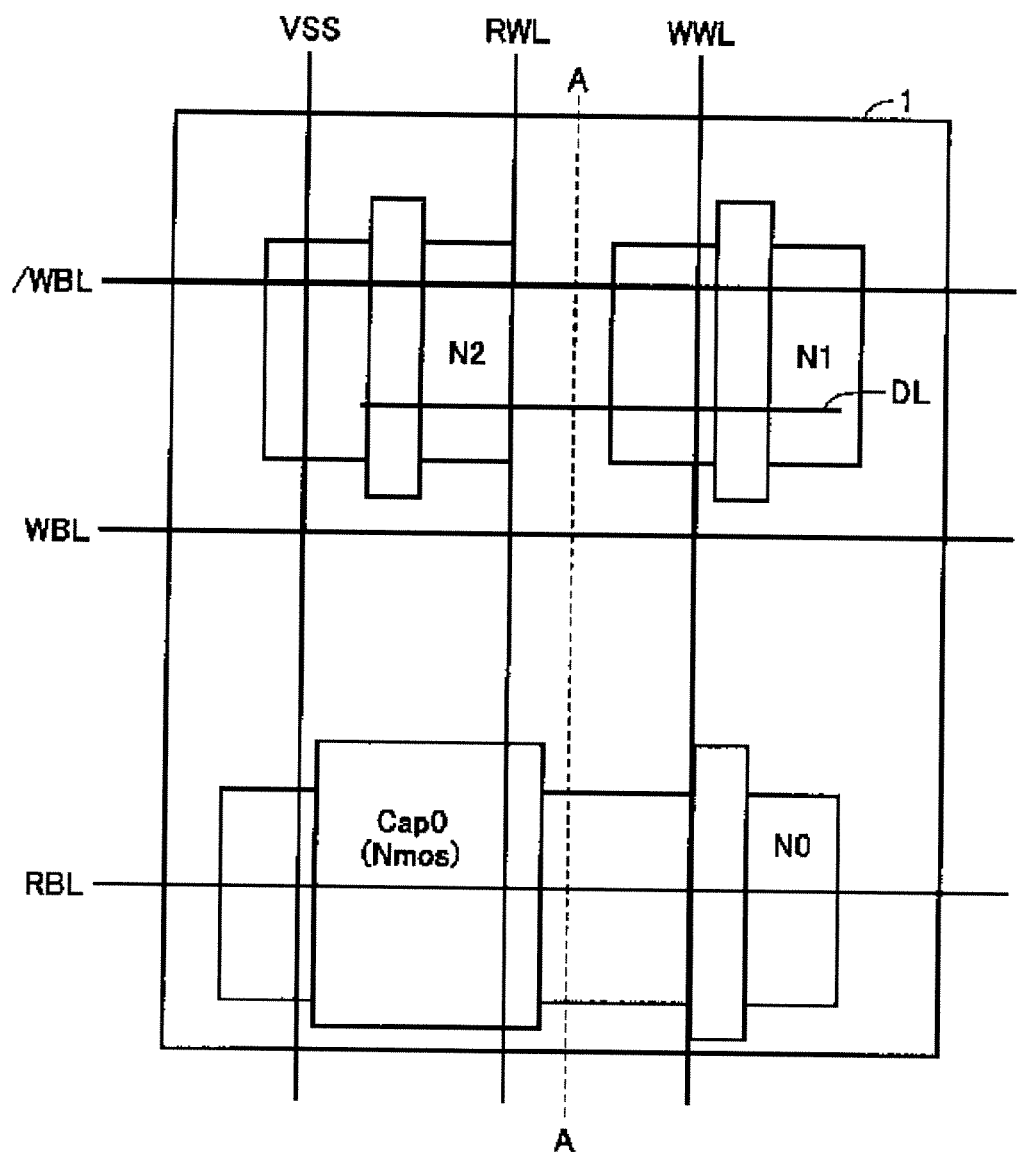
FIG. 10 is a plan view showing a layout of a transistor layer and a wiring layer of a memory cell of the semiconductor storage device according to the embodiment 1 of the present invention.

Next, a layout of the memory cell 1 of the semiconductor storage device 100 according to the embodiment 1 of the present invention will be described. FIG. 10 is a plan view showing a layout of a transistor layer and a wiring layer of the memory cell 1 of the semiconductor storage device 100 according to the embodiment 1 of the present invention. FIG.

Figure 12:
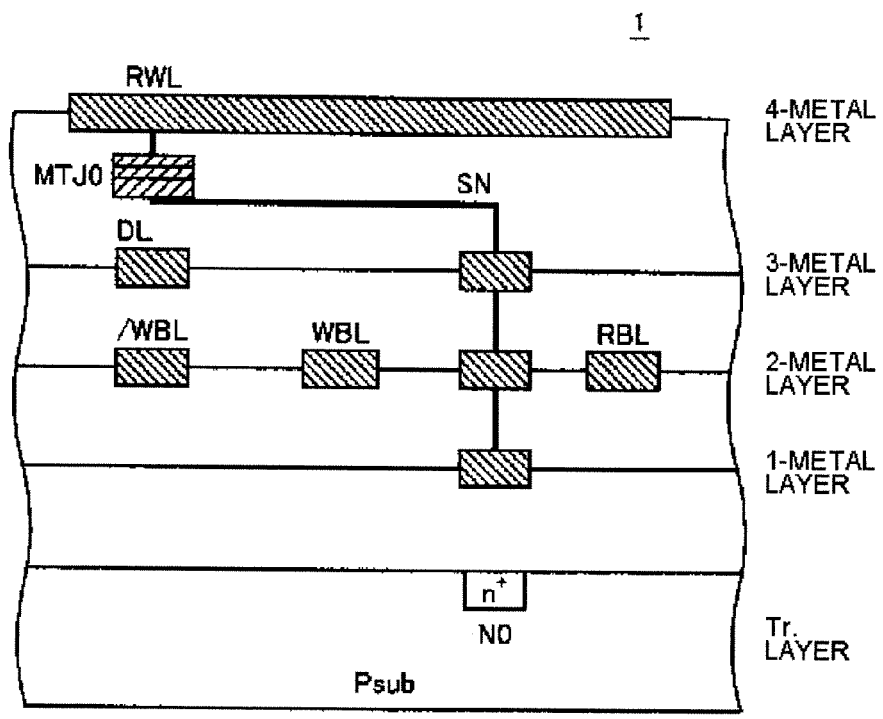
FIG. 12 is a cross-sectional view taken along the plane A-A of FIGS. 10 and 11.
Figure 13:
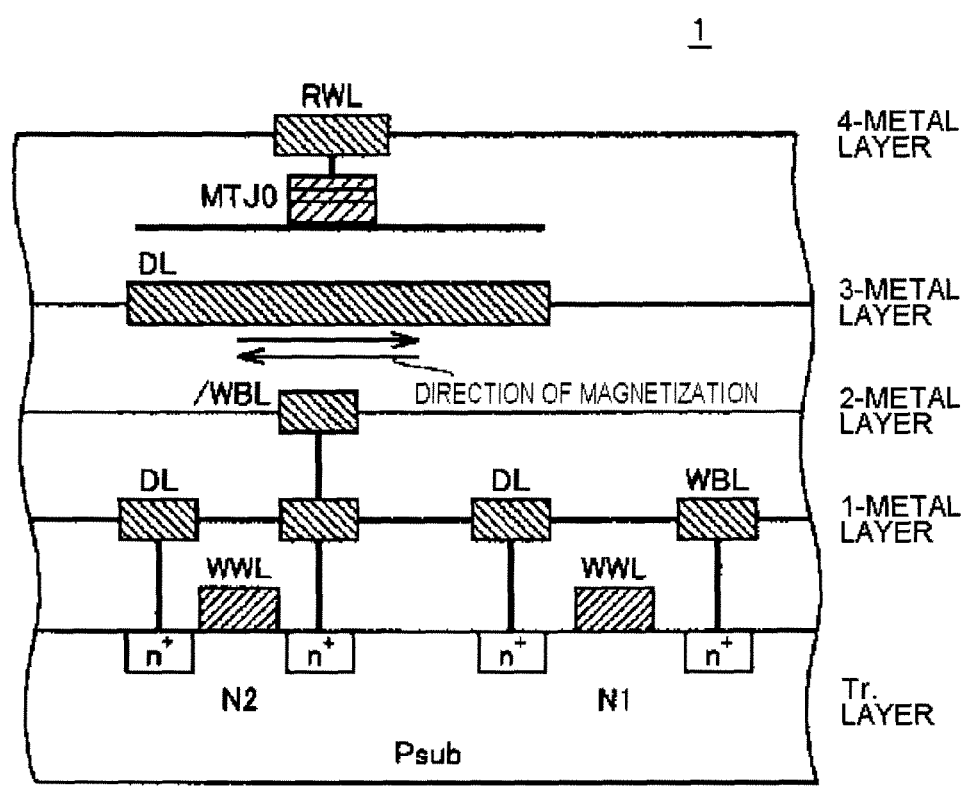
FIG. 13 is a cross-sectional view taken along the plane B-B of FIG. 11.

11 is a plan view showing a layout of a tunnel magnetoresistive element MTJ0 and a wiring layer of the memory cell 1 of the semiconductor storage device 100 according to the embodiment 1 of the present invention. FIG. 12 is a cross-sectional view taken along the plane A-A of FIGS. 10 and 11. FIG. 13 is a cross-sectional view taken along the plane B-B of FIG. 11.

The memory cell 1 shown in FIG. 10 has the Nmos transistors N0, N1 and N2, and the capacitive element Cap0 formed with an Nmos capacity arranged in the transistor layer. Furthermore, the memory cell 1 has the read-bit-line RBL arranged in a second metal layer over the Nmos transistor N0, and the write-bit-lines WBL and /WBL arranged in the second metal layer in proximity over the Nmos transistors N1 and N2. In addition, the memory cell 1 has the digit line DL arranged at a position of a third metal layer lying across the Nmos transistors N1 and N2 in a direction parallel to the write-bit-lines WBL and /WBL. Furthermore, the memory cell 1 has the write-word-line WWL and a ground wiring VSS arranged in a fourth metal layer over the Nmos transistor N2 and the capacitive element Cap0 in a direction perpendicular to the write-bit-lines WBL and /WBL, and the read-word-line RWL arranged in the fourth metal layer over the Nmos transistors N1 and N0.

Figure 11:
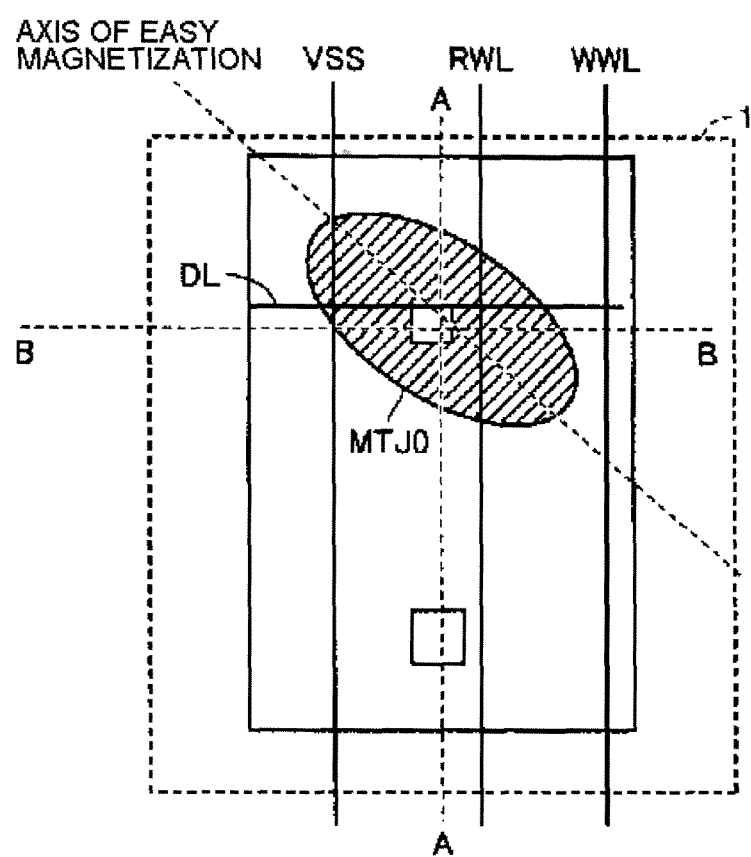
FIG. 11 is a plan view showing a layout of a tunnel magnetoresistive element and a wiring layer of a memory cell of the semiconductor storage device according to the embodiment 1 of the present invention.

The memory cell 1 shown in FIG. 11 has the tunnel magnetoresistive element MTJ0 arranged therein with the axis of easy magnetization inclined approximately 45 degrees with respect to the digit line DL of the third metal layer and the write-word-line WWL of the fourth metal layer.

FIG. 12 shows a cross-section taken along the plane A-A of FIGS. 10 and 11, in which a layout of the transistor layer (Tr. layer), the first metal layer (1-Metal layer), the second metal layer (2-Metal layer), the third metal layer (3-Metal layer) and the fourth metal layer (4-Metal layer) are illustrated. The transistor layer has the Nmos transistor N0 or the like formed over a P-type semiconductor substrate Psub. The first metal layer has formed therein a wiring coupled to the node SN, and the second metal layer has formed therein a wiring coupled to the write-bit-lines WBL and /WBL, the read-bit-line RBL, and the node SN. The third metal layer has formed therein a wiring coupled to the digit line DL and the node SN, and the fourth metal layer has the read-word-line RWL formed therein. Note that, between the third metal layer and the fourth metal layer, there is formed the tunnel magnetoresistive element MTJ0.

FIG. 13 shows a cross-section taken along the plane B-B of FIG. 11, in which a layout of the transistor layer (Tr. layer), the first metal layer (1-Metal layer), the second metal layer (2-Metal layer), the third metal layer (3-Metal layer) and the fourth metal layer (4-Metal layer) are illustrated. The transistor layer has the Nmos transistors N1 and N2 or the like formed over the P-type semiconductor substrate Psub. The first metal layer has formed therein a wiring coupled to the digit line DL, the write-bit-line WBL, and the write-bit-line /WBL of the second metal layer, and the second metal layer has the write-bit-line /WBL formed therein. The third metal layer has the digit line DL and the fourth metal layer has the read-word-line RWL formed therein, respectively. Note that, over the transistor layer there is formed the write-word-line WWL.

As described above, since the semiconductor storage device 100 according to the embodiment 1 of the present invention reads data stored in the memory cell 1 by controlling whether or not to transmit a one-shot pulse of a predetermined width which has entered the read-word-line RWL using an RC circuit formed with the tunnel magnetoresistive element MTJ0 and the capacitive element Cap0, there is no need to include a reference cell using a reference current generation circuit, a highly precise read amplifier circuit and dummy cells or the like. Accordingly, it becomes easy to mixedly mount the semiconductor storage device 100 according to the embodiment 1 of the present invention over a semiconductor substrate without increasing the circuit size.

Note that, in the semiconductor storage device 100 according to the embodiment 1 of the present invention, all the mos transistors included in the memory cell 1 are of the Nmos type. However, the invention is not limited thereto and thus the Nmos transistors N1 and N2 used when writing data may be formed with a Pmos (positive channel Metal Oxide Semiconductor). Forming the Nmos transistors N1 and N2 with the Pmos allows data write operation, in a state that the digit line DL has a voltage level close to the power source voltage VDD level when writing data.

In addition, the semiconductor storage device 100 according to the embodiment 1 of the present invention uses an inverter amplifier as the read amplifier 40. However, the invention is not limited thereto and thus a cross-coupled amplifier will do. Using a cross-coupled amplifier as the read amplifier 40 results in faster data read operation than in the case where an inverter amplifier is used.

Furthermore, the semiconductor storage device 100 according to the embodiment 1 of the present invention has a configuration such that a single tunnel magnetoresistive element MTJ0 (equivalent to 1 bit) is coupled between the read-word-line RWL and the capacitive element Cap0. However, the invention is not limited thereto and may be configured such that a plurality of tunnel magnetoresistive elements MTJ0 (equivalent to n bits) are coupled in parallel between the read-word-line RWL and the capacitive element Cap0. Coupling the tunnel magnetoresistive elements MTJ0 in parallel makes it possible to reduce the capacity of the capacitive element Cap0 forming the RC circuit, thus enabling to downsize the semiconductor storage device 100.

Embodiment 2

Figure 14:
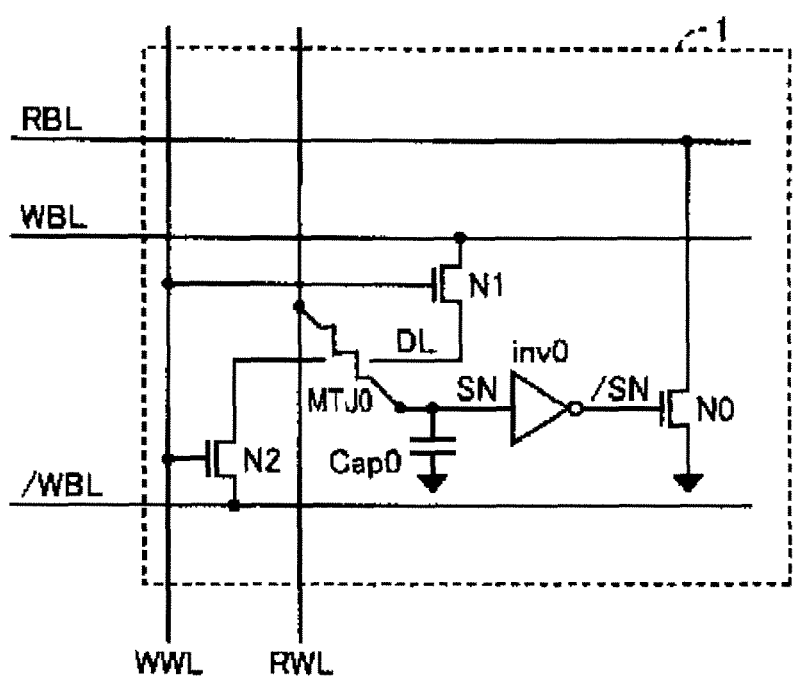
FIG. 14 is a circuit diagram showing a circuit configuration of a memory cell of a semiconductor storage device according to an embodiment 2 of the present invention.

The semiconductor storage device according to an embodiment 2 of the present invention is configured with an inverter provided to the node SN of the memory cell 1 according to the embodiment 1. FIG. 14 is a circuit diagram showing a circuit configuration of a memory cell of the semiconductor storage device according to the embodiment 2 of the present invention. The memory cell 1 shown in FIG. 14 has an inverter inv0 provided between the capacitive element Cap0 and the control electrode of the Nmos transistor N0, inverts the SN signal of the node SN by the inverter inv0 and inputs it to the control electrode of the Nmos transistor N0. It is to be noted that since the semiconductor storage device according to the embodiment 2 of the present invention has the same configuration as the semiconductor storage device 100 according to the embodiment 1 except that the inverter inv0 is provided in the memory cell 1, the same symbol is attached to the same component, as a principle, and the repeated explanation thereof is omitted.

Figure 15:
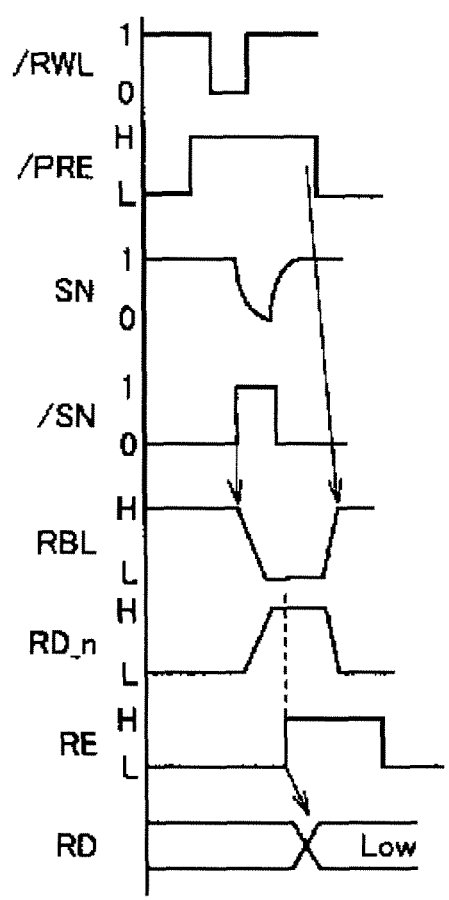
FIG. 15 is a waveform chart showing a signal waveform when the semiconductor storage device according to the embodiment 2 of the present invention reads, from a memory cell 1, data "0" stored therein.
Figure 16:
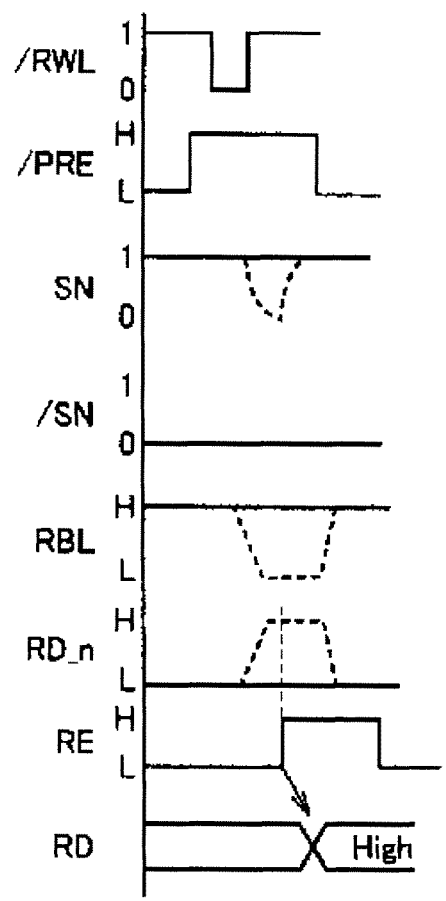
FIG. 16 is a waveform chart showing a signal waveform when the semiconductor storage device according to the embodiment 2 of the present invention reads, from the memory cell 1, data "1" stored therein.

Next, the read operation of data stored in the memory cell 1 by the semiconductor storage device according to the embodiment 2 of the present invention will be described in more detail using signal waveforms. FIG. 15 is a waveform chart showing a signal waveform when the semiconductor storage device according to the embodiment 2 of the present invention reads, from the memory cell 1, data "0" stored therein. FIG. 16 is a waveform chart showing a signal waveform when the semiconductor storage device according to the embodiment 2 of the present invention reads, from the memory cell 1, data "1" stored therein.

The signal waveforms shown in FIGS. 15 and 16 are, from top to bottom of the drawings, an /RWL signal input to the read-word-line RWL, a /PRE signal input to the switch element S1 which pre-charges the read-bit-line RBL to the power source voltage VDD, an SN signal of the node SN, an /SN signal output from the inverter inv0, an RBL signal of the read-bit-line RBL, an RD_n signal obtained by inverting and amplifying the RBL signal, an RE signal to be input to the latch circuit L1, and an RD signal to be output from the latch circuit L1.

First, the semiconductor storage device according to the embodiment 2 of the present invention pre-charges the read-bit-line RBL to the power source voltage level (VDD level) by inputting a /PRE signal at the "L" level to the switch element S1. The semiconductor storage device inputs a /PRE signal at the "H" level to the switch element S1 before reading data from the memory cell 1, in a state that the read-bit-line RBL is retained to the power source voltage level.

The node SN can take one of two states, i.e., whether to transmit or block a one-shot pulse (/RWL signal) to be input to the read-word-line RWL, based on the difference of time constants (2πRC) of the low-pass filter circuit formed with the tunnel magnetoresistive element MTJ0 and the capacitive element Cap0. Note that, the one-shot pulse (/RWL signal) is an inverted signal of the one-shot pulse (RWL signal). Accordingly, since the resistance value of the tunnel magnetoresistive element MTJ0 is small (e.g., 15 KΩ) for the stored data "0", allowing a one-shot pulse with a low frequency pulse (e.g., a pulse width of 1 ns) to pass therethrough, the SN signal of the node SN shown in FIG. 15 falls from "1" to "0" and rises from "0" to "1".

The rectangular waveform of the SN signal of the node SN may deform due to the time constant of the low-pass filter circuit. Accordingly, the SN signal can be inverted by the inverter inv0 into an /SN signal with a rectangular waveform. Rising of the /SN signal from "0" to "1" turns ON the Nmos transistor N0 and grounds the read-bit-line RBL, and whereby the voltage level of the RBL signal of the read-bit-line RBL falls from the "H" level of the power source voltage level to the "L" level of the ground voltage level.

Since the RD_n signal is an inverted and amplified signal of the RBL signal of the read-bit-line RBL, it has a waveform which rises from the "L" level to the "H" level. The latch circuit L1 retains the RD_n signal at the "H" level and outputs an RD signal at the "Low" level corresponding to the data "0" stored in the memory cell 1, at the timing when the RE signal rises from the "L" level to the "H" level. Note that, after the SN signal has fallen from "1" to "0", the read-bit-line RBL is pre-charged to the power source voltage level by inputting a /PRE signal at the "L" level to the switch element S1 again, and the RBL signal returns to the "H" level.

Since the resistance value of the tunnel magnetoresistive element MTJ0 is large (e.g., 30 KΩ) for the stored data "1" and the one-shot pulse of a high frequency pulse (e.g., a pulse width of 1 ns) is blocked, the SN signal of the node SN shown in FIG. 16 does not take a waveform indicated by the dashed line but remains "1". The /SN signal obtained by inverting and amplifying the SN signal by the inverter inv0 remains "0". Since the /SN signal remains "0", the Nmos transistor N0 remains in the OFF state, and the RBL signal of the read-bit-line RBL is retained at the "H" level of the power source voltage level without taking a waveform as shown by the dashed line.

Since the RD_n signal is an inverted and amplified signal of the RBL signal of the read-bit-line RBL, it is retained at the "L" level without taking a waveform as shown by the dashed line. The latch circuit L1 retains the RD_n signal at the "L" level and outputs an RD signal at the "High" level corresponding to the data "1" stored in the memory cell 1, at the timing when the RE signal rises from the "L" level to the "H" level.

As described above, the semiconductor storage device according to the embodiment 2 of the present invention can convert an SN signal into an /SN signal with a rectangular waveform and input it to the control electrode of the Nmos transistor N0 by providing the inverter inv0 in the memory cell 1, thus enhancing filtering effect by the low-pass filter circuit.

Embodiment 3

The semiconductor storage device 100 according to the embodiment 1 of the present invention includes a capacitive element Cap0 using an Nmos capacity in the memory cell 1. However, an embodiment 3 of the present invention will describe a semiconductor storage device having included in the memory cell 1 a capacitive element Cap0 using an MOM (Metal Oxide Metal) capacity or an MIM (Metal Insulator Metal) capacity, in place of the capacitive element Cap0 using an Nmos capacity.

Figure 17:
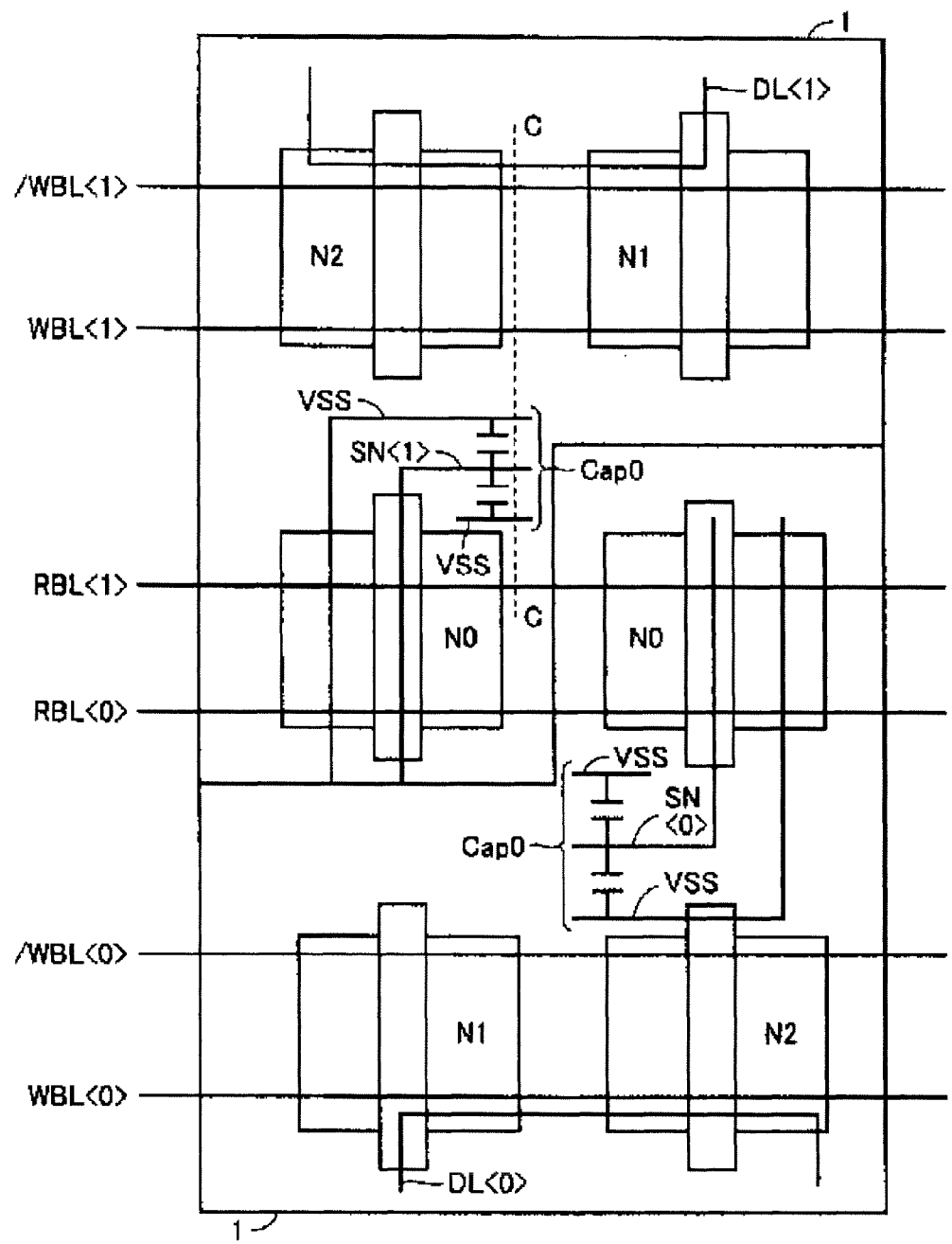
FIG. 17 is a plan view showing a layout of a transistor layer and a wiring layer of two memory cells of a semiconductor storage device according to an embodiment 3 of the present invention.
Figure 18:
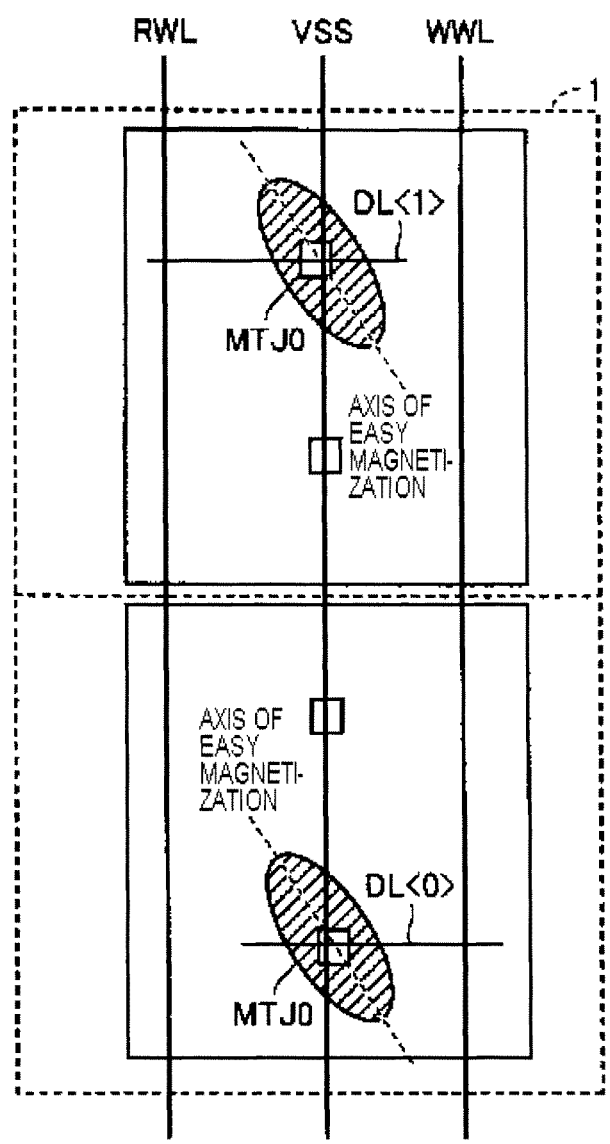
FIG. 18 is a plan view showing a layout of a tunnel magnetoresistive element and a wiring layer of two memory cells of the semiconductor storage device according to the embodiment 3 of the present invention.
Figure 19:
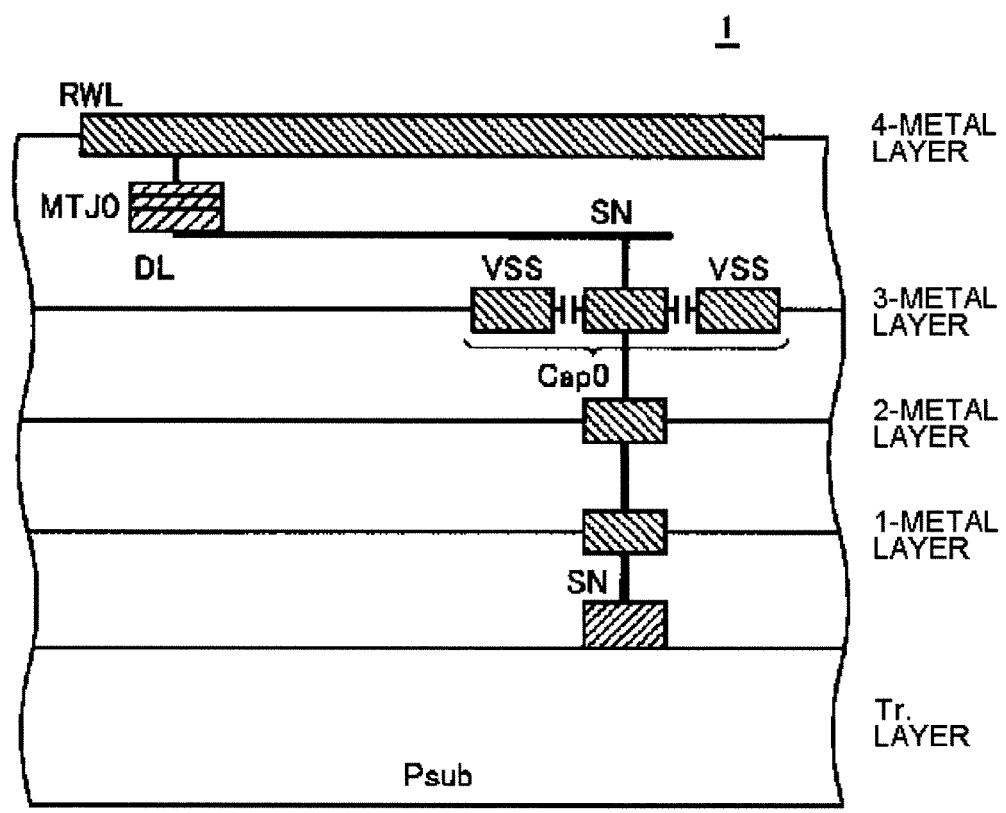
FIG. 19 is a cross-sectional view showing a cross-section taken along a plane C-C of FIG. 17.

FIG. 17 is a plan view showing a layout of a transistor layer and a wiring layer of two memory cells of a semiconductor storage device according to the embodiment 3 of the present invention. FIG. 18 is a plan view showing a layout of a tunnel magnetoresistive element and a wiring layer of two memory cells of the semiconductor storage device according to an embodiment 3 of the present invention. FIG. 19 is a cross-sectional view taken along a plane C-C of FIG. 17. It is to be noted that since the semiconductor storage device according to the embodiment 3 of the present invention has the same configuration as the semiconductor storage device 100 according to the embodiment 1 except that a capacitive element Cap0 using an MOM capacity is included in place of the capacitive element Cap0 using an Nmos capacity, the same symbol is attached to the same component, as a principle, and the repeated explanation thereof is omitted.

The memory cell 1 shown in FIG. 17 has the Nmos transistors N0, N1 and N2 arranged in the transistor layer. Two memory cells 1 (memory cells 1 equivalent to 2 bits) are arranged so that the Nmos transistors N0 are placed adjacent to each other in the horizontal direction in the drawing. In other words, with the memory cell 1 according to the embodiment 3, an Nmos transistor N0 of another memory cells 1 can be placed at the position where the capacitive element Cap0 using an Nmos capacity in the memory cell 1 according to the embodiment 1 has been formed. Accordingly, the circuit size of the memory cell 1 according to the embodiment 3 can be reduced in comparison with the circuit size of the memory cell 1 according to the embodiment 1.

Furthermore, the memory cell 1 shown in FIG. 17 has a read-bit-line RBL<0> for the 0-th bit and a read-bit-line RBL<1> for the first bit arranged in the second metal layer over the Nmos transistor N0. In addition, the memory cell 1 has the write-bit-lines WBL and /WBL for respective bits arranged in the second metal layer over the Nmos transistors N1 and N2. Furthermore, the memory cell 1 has the digit line DL arranged at a position of the third metal layer lying across the Nmos transistors N1 and N2 in a direction parallel to the write-bit-lines WBL and /WBL. In addition, the memory cell 1 has arranged therein the capacitive element Cap0 using an MOM capacity formed with the node SN and the ground wiring VSS.

The memory cell 1 shown in FIG. 18 has the tunnel magnetoresistive element MTJ0 arranged therein with the axis of easy magnetization inclined approximately 45 degrees with respect to the digit line DL of the third metal layer and the ground wiring VSS of the fourth metal layer. Note that, the fourth metal layer has the read-word-line RWL and the write-word-line WWL arranged in parallel to the ground wiring VSS.

FIG. 19 shows a cross-section taken along the plane C-C of FIG. 17, in which a layout of the transistor layer (Tr. layer), the first metal layer (1-Metal layer), the second metal layer (2-Metal layer), the third metal layer (3-Metal layer) and the fourth metal layer (4-Metal layer) are illustrated. The transistor layer has a wiring coupled to the node SN formed over the P-type semiconductor substrate Psub. The first and second metal layers also have formed therein a wiring coupled to the node SN. The third metal layer has formed therein a wiring coupled to the node SN and the ground wiring VSS on both sides of the wiring, which form the capacitive element Cap0 using an MOM capacity of metal-oxide-metal. The fourth metal layer has the read-word-line RWL formed therein. It is to be noted that between the third and the fourth metal layers, there are formed the tunnel magnetoresistive element MTJ0, and the digit line DL linking the tunnel magnetoresistive element MTJ0 and the node SN.

Although the capacitive element Cap0 formed with the wiring coupled to the node SN and the ground wiring VSS is an MOM capacity due to its use of oxide in the insulating layer, the present invention is not limited thereto and may use an insulator other than oxide, which results in an MIM capacity of metal-insulator-metal.

As described above, since the semiconductor storage device according to the embodiment 3 of the present invention includes a capacitive element Cap0 using an MOM or MIM capacity in the memory cell 1 in place of the capacitive element Cap0 using an Nmos capacity, the circuit size can be reduced.

(Exemplary Variation)

Figure 20:
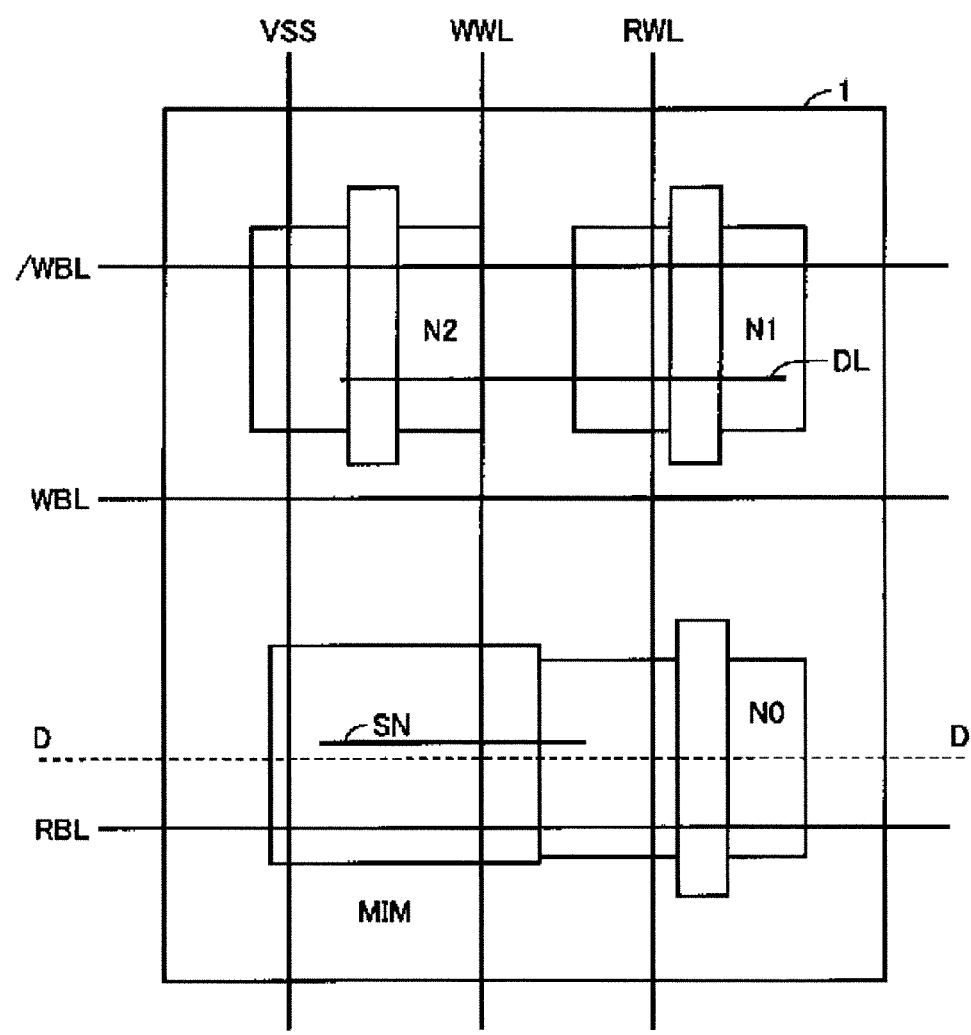
FIG. 20 is a plan view showing a layout of a transistor layer and a wiring layer of a memory cell of a semiconductor storage device according to an exemplary variation of the embodiment 3 of the present invention.
Figure 21:
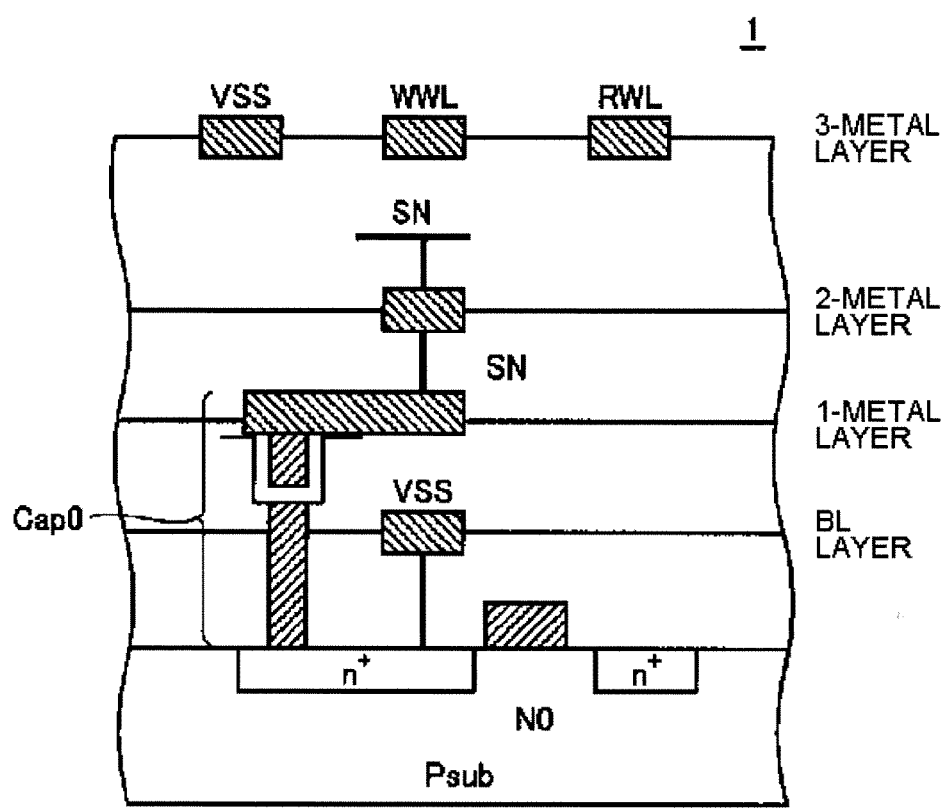
FIG. 21 is a cross-sectional view showing a cross-section taken along a plane D-D of FIG. 20.

The capacitive element Cap0 using an MIM capacity is not limited to the configuration shown in FIGS. 17 to 19, but may be provided at the position where the capacitive element Cap0 using an Nmos capacity in the memory cell 1 according to the embodiment 1 has been formed. FIG. 20 is a plan view showing a layout of a transistor layer and a wiring layer of a memory cell of a semiconductor storage device according to an exemplary variation of the embodiment 3 of the present invention. FIG. 21 is a cross-sectional view taken along the plane D-D of FIG. 20.

The memory cell 1 shown in FIG. 20 has the Nmos transistors N0, N1 and N2, and the capacitive element Cap0 formed with an MIM capacity arranged in the transistor layer. Furthermore, the memory cell 1 has the read-bit-line RBL arranged in the first metal layer over the MIM capacity and the Nmos transistor N0, and the write-bit-lines WBL and /WBL arranged in the first metal layer in proximity over the Nmos transistors N1 and N2. In addition, the memory cell 1 has the digit line DL arranged at a position of the second metal layer lying across the Nmos transistors N1 and N2 in a direction parallel to the write-bit-lines WBL and /WBL. Furthermore, the memory cell 1 has the write-word-line WWL and the ground wiring VSS arranged in the third metal layer over the Nmos transistor N2 and the capacitive element Cap0 in a direction perpendicular to the write-bit-lines WBL and /WBL, and the read-word-line RWL arranged in the third metal layer over the Nmos transistors N1 and N0. The capacitive element Cap0 formed with an MIM capacity has a wiring coupled to the node SN arranged in the first metal layer.

FIG. 21 shows a cross-section taken along the plane D-D of FIG. 20, in which a layout of the transistor layer (Tr. layer), a BL layer, the first metal layer (1-Metal layer), the second metal layer (2-Metal layer) and the third metal layer (3-Metal layer) are illustrated. The transistor layer has the Nmos transistor N0 or the like formed over the P-type semiconductor substrate Psub. The BL layer has formed therein the ground wiring VSS coupled to the Nmos transistor N0. The first and the second metal layers have formed therein a wiring coupled to the node SN. The third metal layer has formed therein the ground wiring VSS, the write-word-line WWL, and the read-word-line RWL. It is to be noted that the capacitive element Cap0 formed with an MIM capacity is configured to include a wiring coupled to the node SN of the first metal layer, a wiring coupled to the Nmos transistor N0, and an insulator sandwiched between both wirings.

Embodiment 4

The semiconductor storage device 100 according to the embodiment 1 of the present invention has the capacitive element Cap0 using an Nmos capacity included in the memory cell 1. However, in an embodiment 4 of the present invention, a semiconductor storage device will be described, having included in the memory cell 1 the capacitive element Cap0 using a DRAM capacity when a DRAM (Dynamic Random Access Memory) is mixedly mounted in place of the capacitive element Cap0 using an Nmos capacity.

Figure 22:
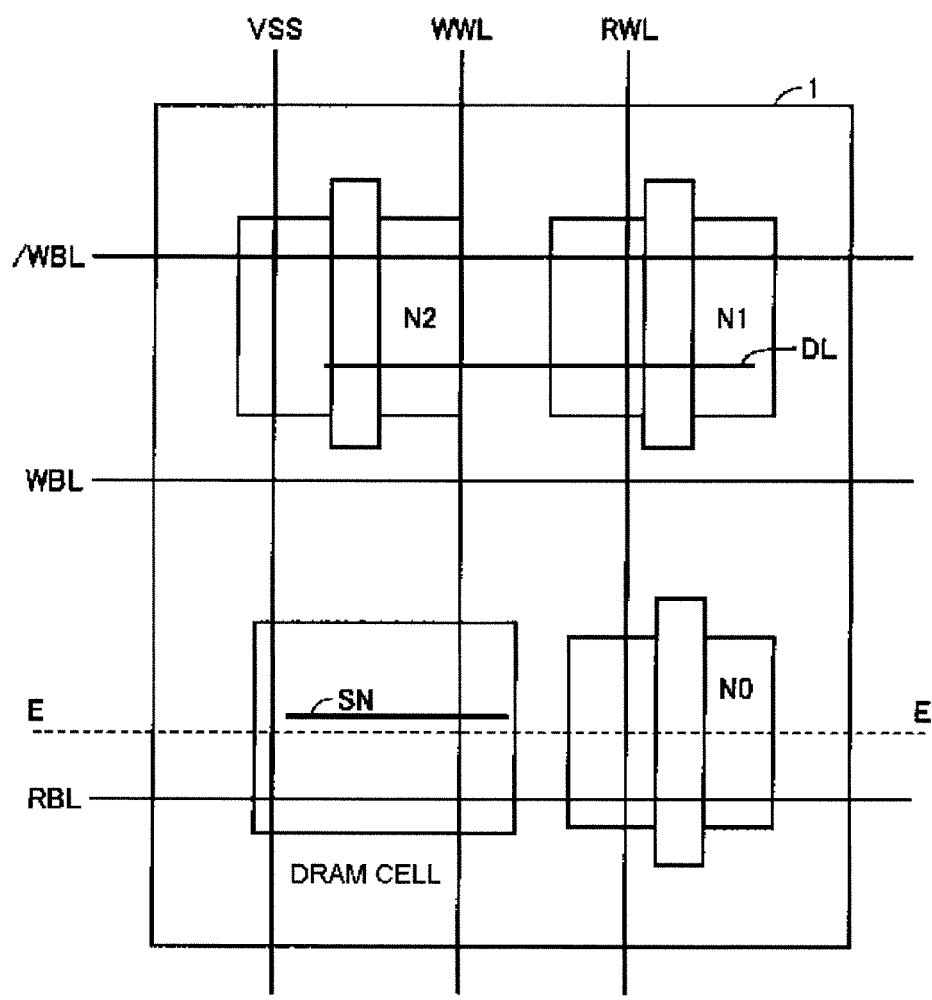
FIG. 22 is a plan view showing a layout of a transistor layer and a wiring layer of a memory cell of a semiconductor storage device according to an exemplary variation of an embodiment 4 of the present invention.
Figure 23:
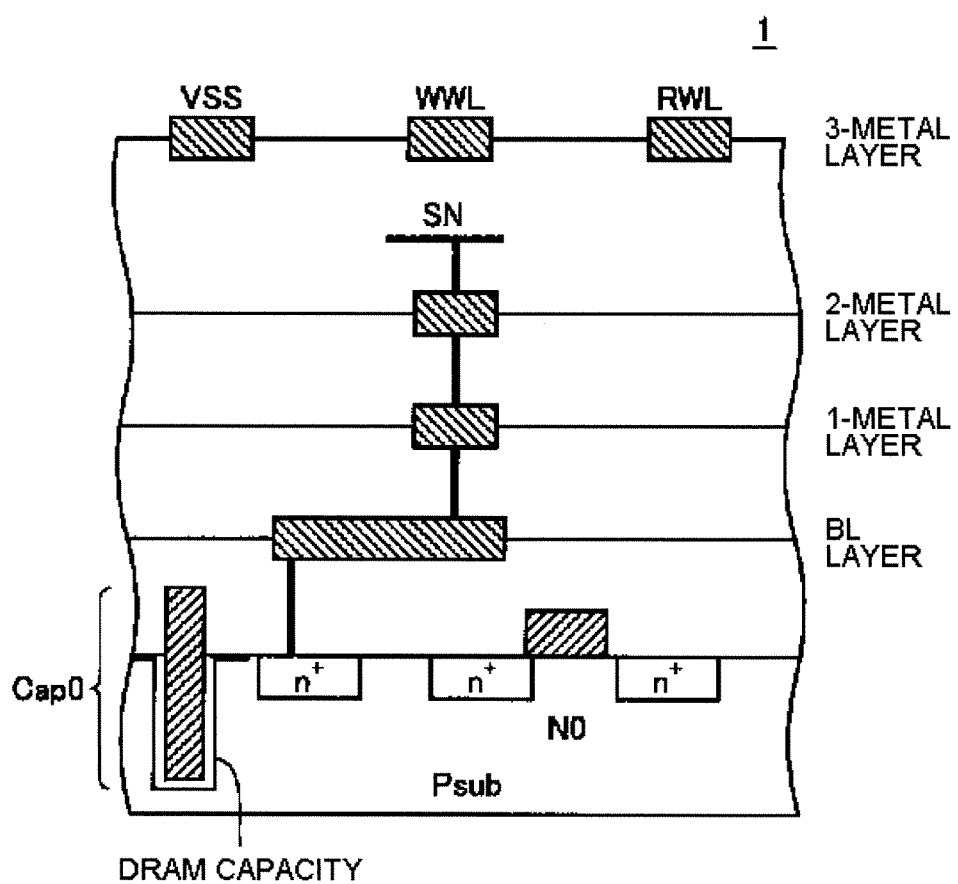
FIG. 23 is a cross-sectional view showing a cross-section taken along a plane D-D of FIG. 22.

FIG. 22 is a plan view showing a layout of a transistor layer and a wiring layer of a memory cell of a semiconductor storage device according to an exemplary variation of the embodiment 4 of the present invention. FIG. 23 is a cross-sectional view taken along the plane D-D of FIG. 22. Note that, since the semiconductor storage device according to the embodiment 4 of the present invention has the same configuration as the semiconductor storage device 100 according to the embodiment 1 except that a capacitive element Cap0 using a DRAM capacity is included in place of the capacitive element Cap0 using an Nmos capacity, the same symbol is attached to the same component, as a principle, and the repeated explanation thereof is omitted.

The memory cell 1 shown in FIG. 22 has the Nmos transistors N0, N1 and N2, and a DRAM cell arranged in the transistor layer. Furthermore, the memory cell 1 has the read-bit-line RBL arranged in the first metal layer over the DRAM cell and the Nmos transistor N0, and the write-bit-lines WBL and /WBL arranged in the first metal layer in proximity over the Nmos transistors N1 and N2. In addition, the memory cell 1 has the digit line DL arranged at a position of the second metal layer lying across the Nmos transistors N1 and N2 in a direction parallel to the write-bit-lines WBL and /WBL. Furthermore, the memory cell 1 has the write-word-line WWL and the ground wiring VSS arranged in the third metal layer over the Nmos transistor N2 and the DRAM cell in a direction perpendicular to the write-bit-lines WBL and /WBL, and the read-word-line RWL arranged in the third metal layer over the Nmos transistors N1 and N0. The DRAM cell has a wiring coupled to the node SN arranged in the BL layer.

FIG. 23 shows a cross-section taken along the plane D-D of FIG. 22, in which a layout of the transistor layer (Tr. layer), the BL layer, the first metal layer (1-Metal layer), the second metal layer (2-Metal layer) and the third metal layer (3-Metal layer) are illustrated. The transistor layer has the Nmos transistor N0 or the like formed over the P-type semiconductor substrate Psub. The BL layer has formed therein a wiring coupled to the Nmos transistor N0 and the node SN. The first and the second metal layers have formed therein a wiring coupled to the node SN. The third metal layer has formed therein the ground wiring VSS, the write-word-line WWL, and the read-word-line RWL. It is to be noted that the transistor layer has a DRAM cell mixedly mounted therein, and a trench DRAM capacity formed therein, which is used as the capacitive element Cap0.

Since the semiconductor storage device according to an embodiment 4 of the present invention includes the capacitive element Cap0 using a DRAM capacity in the memory cell 1 when mixedly mounting a DRAM and thus can form the capacitive element Cap0 in the process of forming the DRAM cell, it can be downsized in comparison with the capacitive element Cap0 using an Nmos capacity.

Note that, the capacitive element Cap0 using a DRAM capacity is not limited to a trench DRAM capacity but may be a stack-type DRAM capacity. In addition, the semiconductor storage device according to the embodiment 4 of the present invention may also be applied when mixedly mounting a volatile memory, and the capacitive element Cap0 may be formed with a volatile memory capacity.

Embodiment 5

The memory cell 1 of the semiconductor storage device 100 according to the embodiment 1 of the present invention writes data in the tunnel magnetoresistive element MTJ0, using a single-axis wiring of the digit line DL arranged diagonally by approximately 45 degrees with respect to the write-word-line WWL. However, the embodiment 5 of the present invention will describe a semiconductor storage device including the memory cell 1 which writes data in the tunnel magnetoresistive element, using a two-axis wiring for the tunnel magnetoresistive element.

Figure 24:
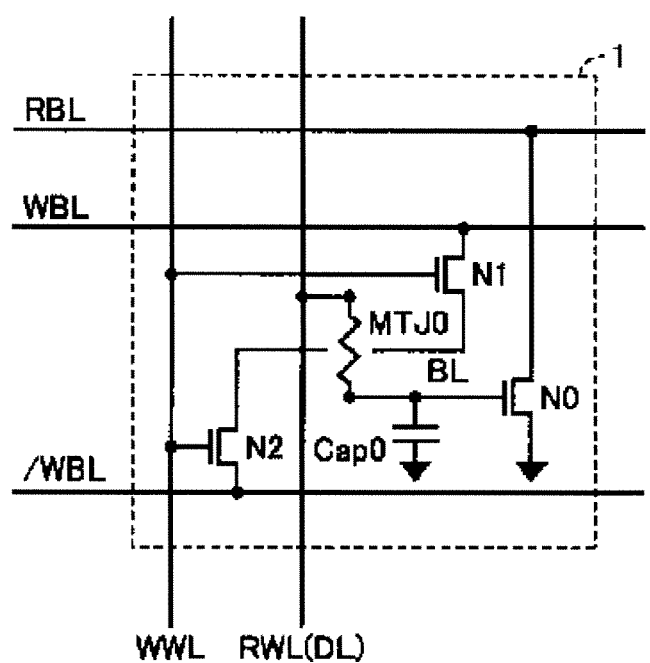
FIG. 24 is a circuit diagram showing a circuit configuration of a memory cell of a semiconductor storage device according to an embodiment 5 of the present invention.

FIG. 24 is a circuit diagram showing a circuit configuration of the memory cell 1 of the semiconductor storage device according to the embodiment 5 of the present invention. The memory cell 1, which is a basic cell of the MRAM, includes the tunnel magnetoresistive element MTJ0, the capacitive element Cap0, and the Nmos transistors N0, N1 and N2. The memory cell 1 includes a read-word-line RWL parallel to the tunnel magnetoresistive element MTJ0 used as the digit line DL, and a bit line BL perpendicular to the tunnel magnetoresistive element MTJ0, with the bit line BL being coupled to the Nmos transistors N1 and N2. It is to be noted that since the semiconductor storage device according to the embodiment 5 of the present invention has the same configuration as the semiconductor storage device 100 according to the embodiment 1 except that the configuration of two-axis wiring (read-word-line RWL and bit line BL) is different for the tunnel magnetoresistive element, the same symbol is attached to the same component, as a principle, and the repeated explanation thereof is omitted. In addition, since the semiconductor storage device according to the embodiment 5 of the present invention has the same configuration as the semiconductor storage device 100 according to the embodiment 1 except for the data write operation, only the data write operation will be described in the following.

FIGS. 25A to 25E are schematic views for explaining an operation of writing data in a tunnel magnetoresistive element using a two-axis wiring. Note that, the read-word-line RWL and the bit line BL are perpendicular to each other, with the tunnel magnetoresistive element MTJ0 arranged between the read-word-line RWL and the bit line BL.

For example, the direction of magnetization of the tunnel magnetoresistive element MTJ0 is oriented in the direction α as shown in FIG. 25A. Then, causing electric current to flow through the read-word-line RWL in the direction α as shown in FIG. 25B forms a magnetic field around the read-word-line RWL in the direction of an arrow in accordance with the right screw rule, and whereby the direction of magnetization of the tunnel magnetoresistive element MTJ0 is oriented in the direction β (a direction rotated clockwise approximately 90 degrees with respect to the direction α).

Next, causing electric current to flow through the read-word-line RWL in the direction α and also causing electric current to flow through the bit line BL in the direction γ (a direction rotated clockwise approximately 180 degrees with respect to the direction α) as shown in FIG. 25C form magnetic fields around the read-word-line RWL and around the bit line BL in the direction of an arrow in accordance with the right screw rule, and whereby the direction of magnetization of the tunnel magnetoresistive element MTJ0 is oriented in the direction δ (a direction rotated clockwise approximately 45 degrees with respect to the direction β)

Then, causing electric current to flow only through the bit line BL in the direction γ as shown in FIG. 25D forms a magnetic field around the read-word-line RWL and the bit line BL in the direction of an arrow in accordance with the right screw rule, and whereby the direction of magnetization of the tunnel magnetoresistive element MTJ0 is oriented in the direction θ (a direction rotated clockwise approximately 90 degrees with respect to the direction δ).

Next, stopping the electric current flowing through the bit line BL orients the direction of magnetization of the tunnel magnetoresistive element MTJ0 in the direction θ as shown in FIG. 25E. In other words, the memory cell 1 can write data in the tunnel magnetoresistive element MTJ0 by changing the direction of magnetization of the tunnel magnetoresistive element MTJ0, which has been oriented to the direction α, to the direction θ, using the two-axis wiring of the read-word-line RWL and the bit line BL.

Figure 26:
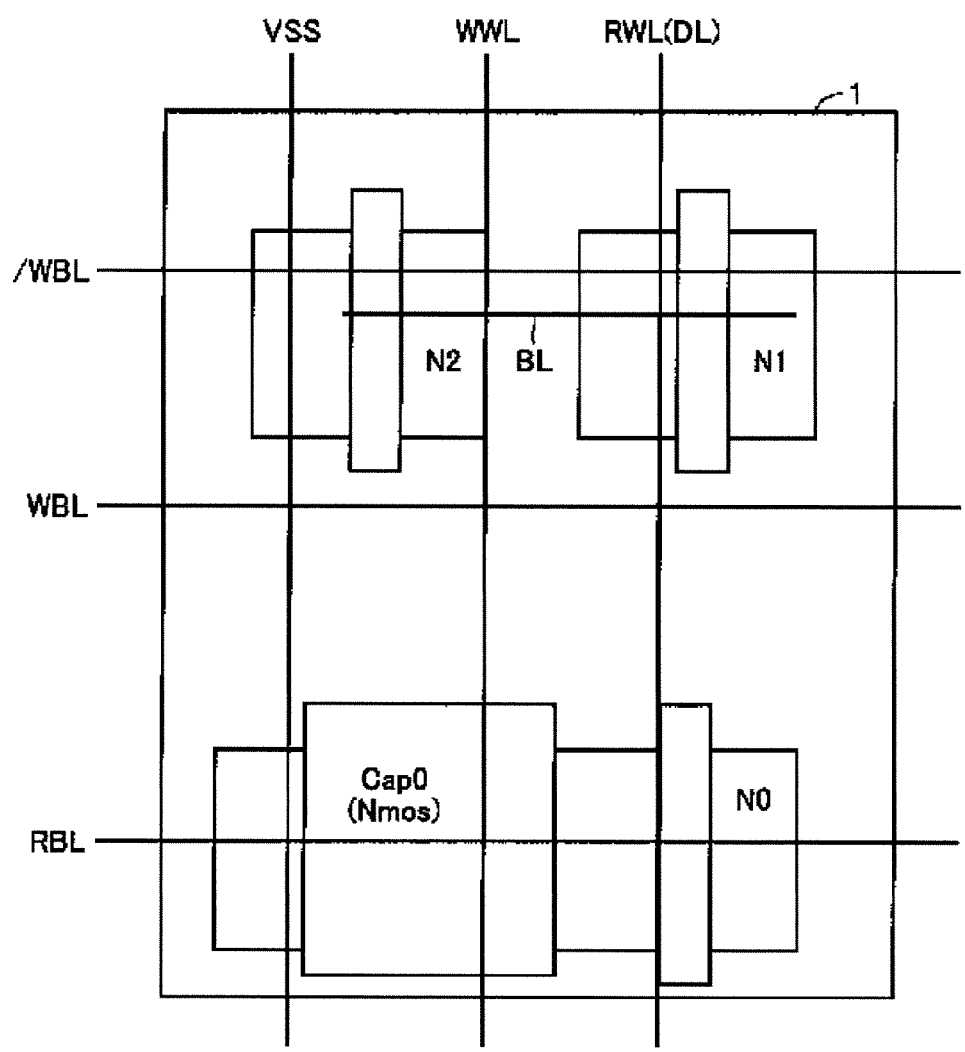
FIG. 26 is a plan view showing a layout of a transistor layer and a wiring layer of a memory cell of the semiconductor storage device according to the embodiment 5 of the present invention.
Figure 27:
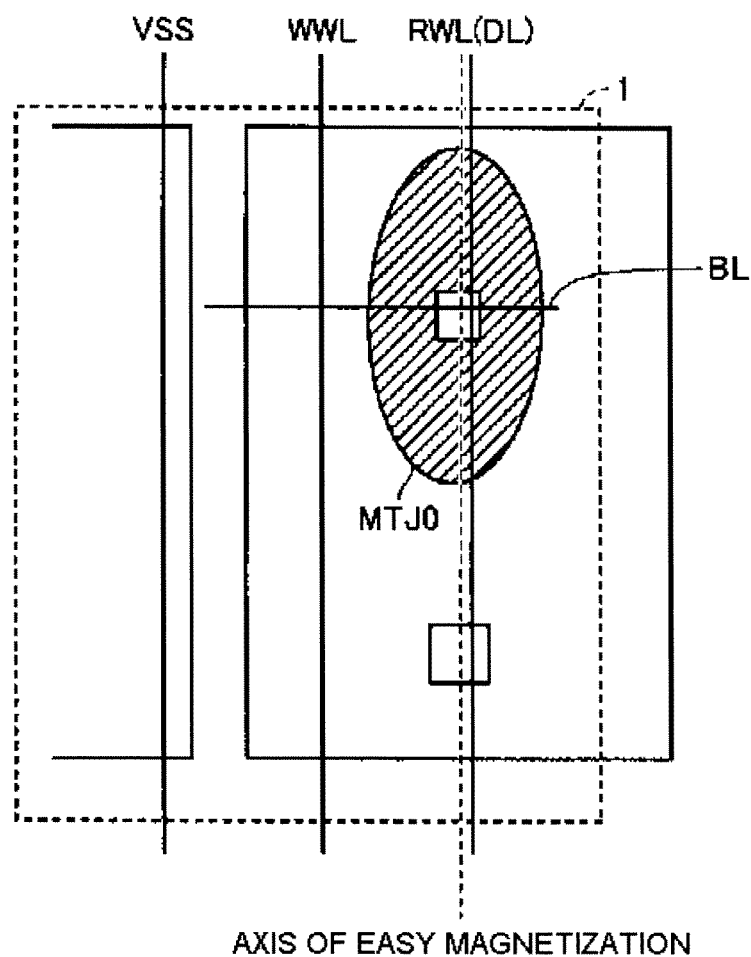
FIG. 27 is a plan view showing a layout of a tunnel magnetoresistive element and a wiring layer of a memory cell of the semiconductor storage device according to the embodiment 5 of the present invention.

Then, a layout of the memory cell 1 of the semiconductor storage device according to the embodiment 5 of the present invention will be described. FIG. 26 is a plan view showing a layout of a transistor layer and a wiring layer of the memory cell 1 of the semiconductor storage device according to the embodiment 5 of the present invention. FIG. 27 is a plan view showing a layout of the tunnel magnetoresistive element MTJ0 and the wiring layer of the memory cell 1 of the semiconductor storage device according to the embodiment 5 of the present invention.

The memory cell 1 shown in FIG. 26 has the Nmos transistors N0, N1 and N2, and the capacitive element Cap0 formed with an Nmos capacity arranged in the transistor layer. Furthermore, the memory cell 1 has the read-bit-line RBL arranged in the second metal layer over the Nmos transistor N0, and the write-bit-lines WBL and /WBL arranged in the second metal layer in proximity over the Nmos transistors N1 and N2. In addition, the memory cell 1 has the bit line BL arranged at a position of the third metal layer lying across the Nmos transistors N1 and N2 in a direction parallel to the write-bit-lines WBL and /WBL. Furthermore, the memory cell 1 has the write-word-line WWL and the ground wiring VSS arranged in the fourth metal layer over the Nmos transistor N2 and the capacitive element Cap0 in a direction perpendicular to the write-bit-lines WBL and /WBL, and the read-word-line RWL (digit line DL) arranged in the fourth metal layer over the Nmos transistors N1 and N0.

The memory cell 1 shown in FIG. 27 has the tunnel magnetoresistive element MTJ0 arranged therein so that the axis of easy magnetization is oriented perpendicular to the bit line BL of the third metal layer, and the axis of easy magnetization is oriented parallel to the read-word-line RWL of the fourth metal layer.

As described above, the memory cell 1 of the semiconductor storage device according to the embodiment 5 of the present invention can write data in the tunnel magnetoresistive element MTJ0 also by using a two-axis wiring of the read-word-line RWL and the bit line BL, and whereby a similar effect to the semiconductor storage device 100 according to the embodiment 1 can be obtained.

Embodiment 6

In the memory cell 1 of the semiconductor storage device 100 according to the embodiment 1 of the present invention, a low-pass filter circuit is formed with the resistance of the tunnel magnetoresistive element MTJ0 and the capacitive element Cap0. However, the embodiment 6 of the present invention will describe a semiconductor storage device including the memory cell 1 having a high-pass filter circuit formed with the resistance of the tunnel magnetoresistive element MTJ0 and the capacitive element Cap0.

Figure 28:
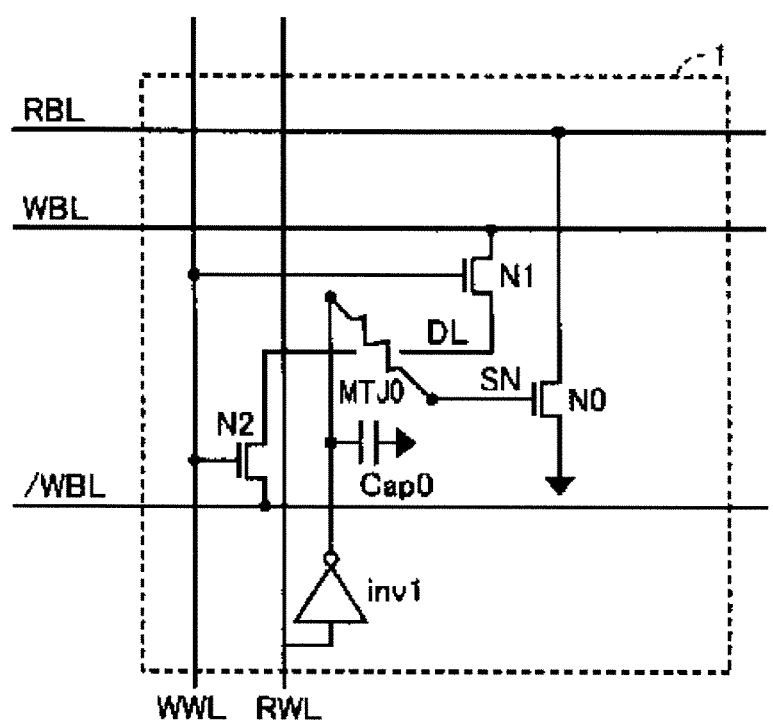
FIG. 28 is a circuit diagram showing a circuit configuration of a memory cell of a semiconductor storage device according to an embodiment 6 of the present invention.

FIG. 28 is a circuit diagram showing a circuit configuration of the memory cell 1 of the semiconductor storage device according to the embodiment 6 of the present invention. The memory cell 1, which is a basic cell of the MRAM, includes the tunnel magnetoresistive element MTJ0, the capacitive element Cap0, the Nmos transistor N0 (first mos transistor), the digit line DL, the Nmos transistor N1 (second mos transistor), the Nmos transistor N2 (third mos transistor), and an inverter inv1.

The tunnel magnetoresistive element MTJ0 has one end coupled to the capacitive element Cap0 and the other end coupled to the control electrode of the Nmos transistor N0. The resistance value of the tunnel magnetoresistive element MTJ0 varies according to the direction of magnetization. It is also assumed in the embodiment of the present invention that "0" is recorded when the resistance value of the tunnel magnetoresistive element MTJ0 is R, and "1" is stored when the resistance value is R+ΔR.

The capacitive element Cap0 is coupled between one end of the tunnel magnetoresistive element MTJ0 and the inverter inv1. The capacitive element Cap0, forming an RC circuit together with the tunnel magnetoresistive element MTJ0, functions in the embodiment 6 of the present invention as a high-pass filter circuit for a one-shot pulse input from the read-word-line RWL to the control electrode of the Nmos transistor N0.

The Nmos transistor N0 has its control electrode coupled to the tunnel magnetoresistive element MTJ0, and one of its current electrodes coupled to the read-bit-line RBL, respectively. Then, the Nmos transistor N0 sets the voltage of the read-bit-line RBL, which has been pre-charged to a predetermined voltage, to the ground voltage by switching to ON state according to the data stored in the tunnel magnetoresistive element MTJ0.

The digit line DL, intersecting with the tunnel magnetoresistive element MTJ0 at a predetermined angle, supplies magnetization current to the tunnel magnetoresistive element MTJ0.

The Nmos transistor N1 has its control electrode coupled to the write-word-line WWL, one current electrode coupled to the write-bit-line WBL, and the other current electrode coupled to one end of the digit line DL.

The Nmos transistor N2 has its control electrode coupled to the write-word-line WWL, one current electrode coupled to the other end of the digit line, and the other current electrode coupled to the write-bit-line /WBL.

The inverter inv1, which is coupled between the read-word-line RWL and the capacitive element Cap0, inverts the /RWL signal input from the read-word-line RWL (inverted signal of the RWL signal) into an RWL signal, and inputs it to the RC circuit which functions as the high-pass filter circuit.

In the semiconductor storage device according to the embodiment 6 of the present invention, the high-pass filter circuit is formed with the resistance of the tunnel magnetoresistive element MTJ0 and the capacitive element Cap0 of the memory cell 1. Therefore, the semiconductor storage device according to the embodiment 6 of the present invention uses a method of determining and reading whether the state of stored data is "0" or "1" based on the time constant ratio of the high-pass filter circuit, instead of the method of determining and reading whether the state of stored data is "0" or "1" based on the magnetoresistance ratio (MR ratio) of the tunnel magnetoresistive element MTJ0.

In other words, the semiconductor storage device according to the embodiment 6 of the present invention determines whether the state of stored data is "0" or "1" based on two states, i.e., whether the one-shot pulse that entered the tunnel magnetoresistive element MTJ0 passes through the high-pass filter circuit or is blocked by the high-pass filter circuit. Then, the semiconductor storage device according to the embodiment 6 of the present invention then varies the voltage of the read-bit-line RBL which has been pre-charged to a predetermined voltage, by the Nmos transistor N0 coupled to the high-pass filter circuit, to read the data determined by the read amplifier 40. Therefore, it becomes possible for the semiconductor storage device according to the embodiment 6 of the present invention to cause the read-bit-line RBL to oscillate at full amplitude, thus enabling to realize an MRAM capable of noise immune, high-speed reading, without requiring a highly precise read amplifier circuit.

In addition, since all the input and output signals of the memory cell 1 also in the semiconductor storage device according to the embodiment 6 of the present invention can be converted into digital signals, it is not necessary to apply bias voltage or read analog signals from a read-bit-line as with a conventional MRAM, facilitating substitution of the SRAM memory and register memory.

Figure 29:
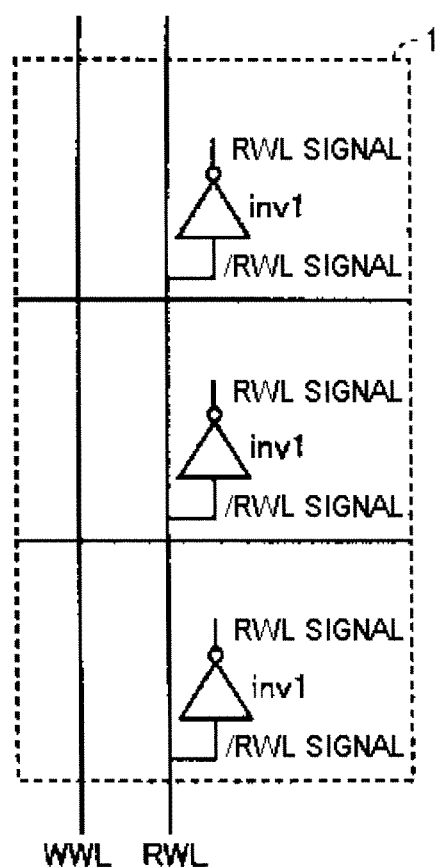
FIG. 29 is a schematic diagram showing an arrangement of memory cells of the semiconductor storage device according to the embodiment 6 of the present invention.

FIG. 29 is a schematic diagram showing an arrangement of the memory cells 1 of the semiconductor storage device according to the embodiment 6 of the present invention. The memory cells 1 in FIG. 29 are shown in a manner arranged along the read-word-line RWL and the write-word-line WWL. Each of the memory cells 1 includes the inverter inv1 therein, and an /RWL signal input to the read-word-line RWL is inverted into an RWL signal by the inverter inv1 of each of the memory cells 1.

Note that, since the semiconductor storage device according to the embodiment 6 of the present invention has the same configuration as the semiconductor storage device 100 according to the embodiment 1 except that a high-pass filter is provided therein, the same symbol is attached to the same component, as a principle, and the repeated explanation thereof is omitted.

Figure 30:
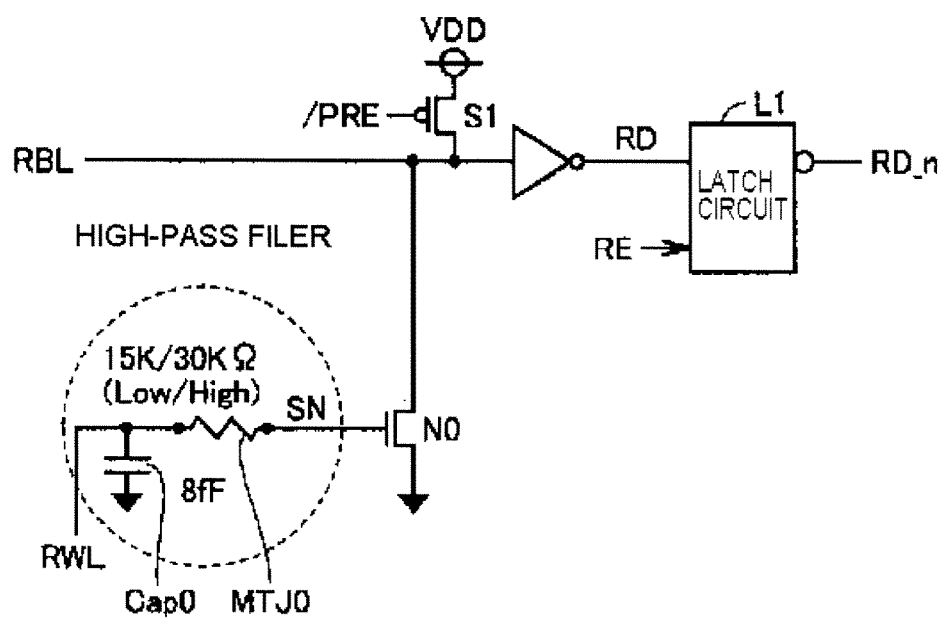
FIG. 30 is a schematic view showing a configuration of a high-pass filter circuit of a memory cell of the semiconductor storage device according to the embodiment 6 of the present invention.

Next, the read operation of data stored in the memory cell 1 by the semiconductor storage device according to the embodiment 6 of the present invention will be described. FIG. 30 is a schematic view showing a configuration of a high-pass filter circuit of the memory cell 1 of the semiconductor storage device according to the embodiment 6 of the present invention.

The tunnel magnetoresistive element MTJ0 shown in FIG. 30 has one end coupled to the capacitive element Cap0, and the other end coupled to the control electrode of the Nmos transistor N0. Seen from the read-word-line RWL side, a high-pass filter circuit with a time constant of $2\pi RC$ is formed with the tunnel magnetoresistive element MTJ0 with a resistance value R and the capacitive element Cap0 with a capacity value C and, according to the pulse width of a one-shot pulse (RWL signal) input from the read-word-line RWL, two states can be taken, i.e., whether the one-shot pulse (RWL signal) is transmitted to the node SN (passes through the high-pass filter circuit) or is not transmitted thereto (blocked by the high-pass filter circuit).

For example, assuming that the resistance value of the tunnel magnetoresistive element MTJ0 storing data "1" is 30 KΩ and the capacity value of the capacitive element Cap0 is 8 fF, the time constant becomes 1.508 ns, thus forming a high-pass filter circuit that filters high frequency pulses with frequencies equal to or higher than 1.508 ns. Accordingly, when the pulse width of a one-shot pulse (RWL signal) at the standby state "0" is 1 ns, the one-shot pulse passes through the high-pass filter circuit formed with the tunnel magnetoresistive element MTJ0 and the capacitive element Cap0, with the state of the node SN transiting from "0" to "1" to "0".

In addition, assuming that the resistance value of the tunnel magnetoresistive element MTJ0 storing data "0" is 17.5 KΩ and the capacity value of the capacitive element Cap0 is 8 fF, the time constant becomes 0.879 ns, thus forming a high-pass filter circuit that filters low frequency pulses with frequencies equal to or higher than 0.879 ns. Accordingly, when the pulse width of a one-shot pulse (RWL signal) at the standby state "0" is 1 ns, the one-shot pulse is blocked by high-pass filter circuit formed with the tunnel magnetoresistive element MTJ0 and the capacitive element Cap0, with the state of the node SN remaining at "0".

Figure 31:
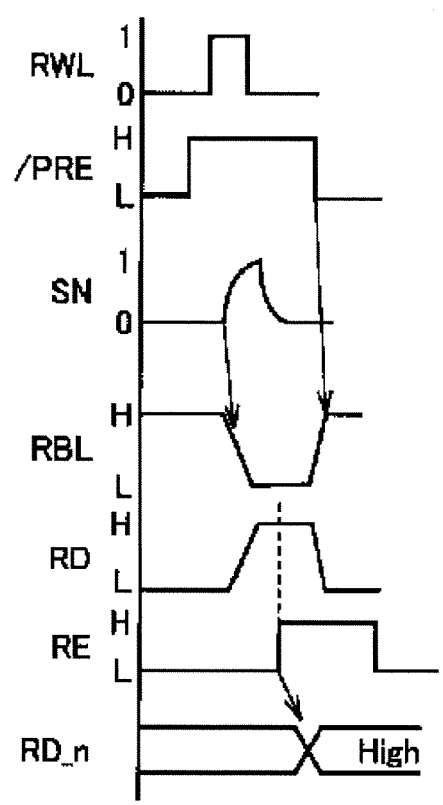
FIG. 31 is a waveform chart showing a signal waveform when the semiconductor storage device according to the embodiment 6 of the present invention reads, from a memory cell, data "0" stored therein.
Figure 32:
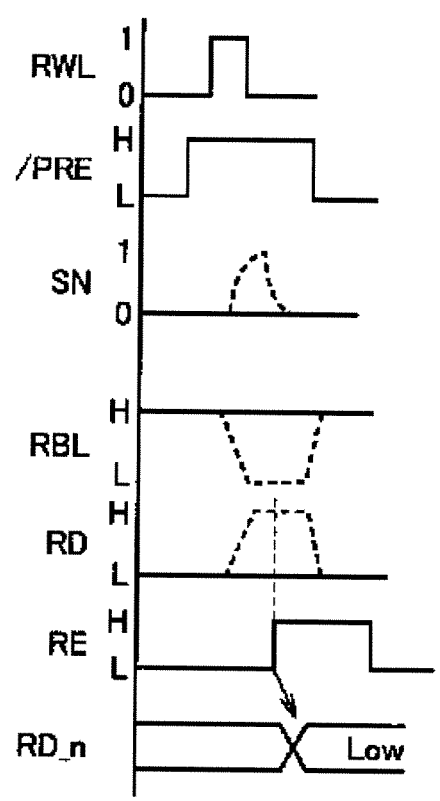
FIG. 32 is a waveform chart showing a signal waveform when the semiconductor storage device according to the embodiment 6 of the present invention reads, from a memory cell, data "1" stored therein.

Further, the read operation of data stored in the memory cell 1 by the semiconductor storage device according to the embodiment 6 of the present invention will be described in more detail using signal waveforms. FIG. 31 is a waveform chart showing a signal waveform when the semiconductor storage device according to the embodiment 6 of the present invention reads, from the memory cell 1, data "0" stored therein. FIG. 32 is a waveform chart showing a signal waveform when the semiconductor storage device according to the embodiment 6 of the present invention reads, from the memory cell 1, data "1" stored therein.

The signal waveforms shown in FIGS. 31 and 32 are, from top to bottom of the drawings, an RWL signal input to the read-word-line RWL, a /PRE signal input to a switch element S1 which pre-charges the read-bit-line RBL to the power source voltage VDD, an SN signal of the node SN, an RBL signal of the read-bit-line RBL, an RD_n signal obtained by inverting and amplifying the RBL signal, an RE signal to be input to the latch circuit L1, and an RD signal to be output from the latch circuit L1.

First, the semiconductor storage device according to the embodiment 6 of the present invention pre-charges the read-bit-line RBL to the power source voltage level (VDD level) by inputting a /PRE signal at the "L" level to the switch element S1. The semiconductor storage device according to the embodiment 6 of the present invention inputs a /PRE signal at the "H" level to the switch element S1 before reading data from the memory cell 1, with the read-bit-line RBL being retained to the power source voltage level.

The node SN can take one of two states, i.e., whether to transmit or block a one-shot pulse (/RWL signal), based on the difference of time constants (2πRC) of the high-pass filter circuit formed with the tunnel magnetoresistive element MTJ0 and the capacitive element Cap0.

Accordingly, since the resistance value of the tunnel magnetoresistive element MTJ0 is large (e.g., 30 KΩ) for the stored data "1", allowing a one-shot pulse with a high frequency pulse (e.g., a pulse width ° fins) to pass through, the SN signal of the node SN shown in FIG. 31 rises from "0" to "1" and falls from "1" to "0". Rising of the SN signal of the node SN from "0" to "1" turns ON the Nmos transistor N0, grounds the read-bit-line RBL, and falls the voltage level of the RBL signal of the read-bit-line RBL from the "H" level of the power source voltage level to the "L" level of the ground voltage level.

Since the RD signal is an inverted and amplified signal of the RBL signal of the read-bit-line RBL, it has a waveform which rises from the "L" level to the "H" level. The latch circuit L1 retains the RD signal at the "H" level and outputs an RD_n signal at the "High" level corresponding to data "1" stored in the memory cell 1, at the timing when the RE signal rises from the "L" level to the "H" level. Note that, the read-bit-line RBL is pre-charged to the power source voltage level by inputting the /PRE signal at the "L" level to the switch element S1 again after the SN signal has fallen from "1" to "0", and the RBL signal returns to the "H" level.

Since the resistance value of the tunnel magnetoresistive element MTJ0 is small (e.g., 15 KΩ) for the stored data "0", blocking the one-shot pulse of a low frequency pulse (e.g., a pulse width of 1 ns), the SN signal of the node SN shown in FIG. 32 does not take a waveform indicated by the dashed line but remains "0". Since the SN signal of the node SN remains "0", the Nmos transistor N0 remains in the OFF state, and the RBL signal of the read-bit-line RBL does not take the waveform indicated by the dashed line but remains at the "H" level of the power source voltage level.

Since the RD signal is an inverted and amplified signal of the RBL signal of the read-bit-line RBL, it does not take the waveform indicated by the dashed line but remains at the "L" level. The latch circuit L1 retains the RD signal at the "L" level and outputs an RD_n signal at the "Low" level corresponding to the data "0" stored in the memory cell 1, at the timing when the RE signal rises from the "L" level to the "H" level.

As described above, since the memory cell 1 of the semiconductor storage device according to the embodiment 6 of the present invention includes an RC circuit formed with the tunnel magnetoresistive element MTJ0 and the capacitive element Cap0 which functions as a high-pass filter circuit, an effect similar to that of the semiconductor storage device 100 according to the embodiment 1 can be obtained.

It should be considered that all the embodiments disclosed herein are only illustrative and not limiting. The scope of the present invention, defined by appended claims rather than the above description, is intended to include any modification within the claims and equivalents thereof.

What is claimed is:

1. A semiconductor storage device comprising:
a memory array including a plurality of memory cells arranged in a matrix; a plurality of read-word-lines and a plurality of write-word-lines, each of which is coupled to the memory cells belonging to a column in the memory array; a plurality of read-bit-lines, each of which is precharged to a predetermined voltage and coupled to the memory cells belonging to a row in the memory array; a plurality of first write-bit-lines and a plurality of second write-bit-lines, each of which is coupled to the memory cells belonging to a row in the memory array; a first driver configured to output a one-shot pulse having a predetermined width to the read-word-line when reading data; a plurality of read circuits, each configured to read data stored in the memory cell according to a voltage of the read-bit-line; a second driver configured to output a write signal having a predetermined voltage to the write-word-line when writing data; and a write circuit which supplies a signal according to values of data to be written in the first write-bit-line and the second write-bit-line, wherein the memory cell has a first mos transistor with one of current electrodes being coupled to the read-bit-line; a tunnel magnetoresistive element coupled between a control electrode of the first mos transistor and the read-word-line; and a capacitive element coupled to the tunnel magnetoresistive element and forming an RC circuit together with the tunnel magnetoresistive element.

2. The semiconductor storage device according to claim 1, wherein the memory cell has the read-word-line coupled to one end of the tunnel magnetoresistive element, and the capacitive element coupled between the other end of the tunnel magnetoresistive element and the control electrode of the first mos transistor.

3. The semiconductor storage device according to claim 1, wherein the memory cell has the capacitive element coupled between one end of the tunnel magnetoresistive element and the read-word-line, and the control electrode of the first mos transistor coupled to the other end of the tunnel magnetoresistive element.

4. The semiconductor storage device according to claim 2, wherein the memory cell further includes an inverter having an input terminal coupled to the other end of the tunnel magnetoresistive element and an output terminal coupled to the control electrode of the first mos transistor.

5. The semiconductor storage device according to claims 2, wherein the memory cell further includes: a digit line intersecting with the tunnel magnetoresistive element at a predetermined angle to supply magnetization current to the tunnel magnetoresistive element; a second mos transistor having a control electrode coupled to the write-word-line, one current electrode coupled to the first write-bit-line, and the other current electrode coupled to one end of the digit line; and a third mos transistor having a control electrode coupled to the write-word-line, one current electrode coupled to the other end of the digit line, and the other current electrode coupled to the second write-bit-line.

6. The semiconductor storage device according to claim 2, wherein the memory cell further includes: a second mos transistor having a control electrode coupled to the write-word-line, and one of current electrodes coupled to the first write-bit-line; a third mos transistor having a control electrode coupled to the write-word-line, and one of current electrodes coupled to the second write-bit-line; and a bit line linking together the other current electrodes of the second mos transistor and the third mos transistor to supply magnetization current for generating a magnetic field in the tunnel magnetoresistive element, and wherein the tunnel magnetoresistive element is arranged to be perpendicular to the bit line and parallel to the write-word-line.

7. The semiconductor storage device according to claim 5, wherein the first to the third mos transistors are Nmos transistors.

8. The semiconductor storage device according to claim 5, wherein the first mos transistor is an Nmos transistor, and the second and the third mos transistors are Pmos transistors.

9. The semiconductor storage device according to claim 1, wherein the capacitive element is formed in the order of metal-insulator-metal or metal-oxide-metal.

10. The semiconductor storage device according to claim 1, wherein, when a volatile memory is mixedly mounted, the capacitive element is formed with a capacity of the volatile memory.

11. The semiconductor storage device according to claim 1, wherein the read circuit uses a cross-coupled amplifier for an amplifier that amplifies a signal read from the memory cell.

12. The semiconductor storage device according to claims 1, wherein the tunnel magnetoresistive element has a plurality of resistive elements coupled in parallel.

* * * * *